United States Patent [19]

McCarthy

[11] Patent Number: 5,674,758
[45] Date of Patent: Oct. 7, 1997

[54] SILICON ON INSULATOR ACHIEVED USING ELECTROCHEMICAL ETCHING

[75] Inventor: Anthony M. McCarthy, Menlo Park, Calif.

[73] Assignee: Regents of the University of California, Oakland, Calif.

[21] Appl. No.: 484,062

[22] Filed: Jun. 6, 1995

[51] Int. Cl.$^6$ .................... H01L 21/84; H01L 21/3063
[52] U.S. Cl. .................... 437/21; 437/40; 437/86; 437/974; 148/DIG. 12; 148/DIG. 135; 156/628.1; 156/629.1; 156/648.1; 156/657.1
[58] Field of Search .................... 437/21, 40 TFT, 437/41 TFT, 62, 86, 974; 148/DIG. 12, DIG. 135; 156/628.1, 629.1, 631.1, 648.1, 657.1

[56] References Cited

U.S. PATENT DOCUMENTS

| | | | |
|---|---|---|---|
| 3,332,137 | 7/1967 | Kenney . | |
| 3,647,581 | 3/1972 | Mash | 148/175 |
| 3,661,741 | 5/1972 | Meek | 437/974 |
| 4,050,979 | 9/1977 | Smeltzer et al. | 437/974 |
| 4,880,493 | 11/1989 | Ashby et al. | 156/657.1 |
| 4,946,735 | 8/1990 | Lee et al. | 437/974 |
| 4,952,446 | 8/1990 | Lee et al. | 437/974 |
| 4,980,308 | 12/1990 | Hayashi et al. | 437/974 |
| 5,059,543 | 10/1991 | Wise et al. | 437/974 |
| 5,129,982 | 7/1992 | Wang et al. | 156/657.1 |
| 5,168,078 | 12/1992 | Reisman et al. | 148/DIG. 12 |
| 5,206,749 | 4/1993 | Zavracky et al. | 359/59 |
| 5,240,883 | 8/1993 | Abe et al. | 437/974 |
| 5,261,999 | 11/1993 | Pinker et al. | 437/974 |
| 5,279,703 | 1/1994 | Haberger et al. | 156/635 |
| 5,343,064 | 8/1994 | Spangler et al. | 257/350 |
| 5,347,154 | 9/1994 | Takahashi et al. | 257/347 |
| 5,434,433 | 7/1995 | Takasu et al. | 257/59 |
| 5,455,202 | 10/1995 | Malloy et al. | 437/974 |
| 5,565,060 | 10/1996 | Austin et al. | 156/657.1 |

FOREIGN PATENT DOCUMENTS

| | | | |
|---|---|---|---|
| 268380 | 5/1988 | European Pat. Off. . | |
| 52-52582 | 4/1977 | Japan | 437/974 |
| 53-20872 | 2/1978 | Japan | 156/629.1 |

(List continued on next page.)

OTHER PUBLICATIONS

R.T. Hodgson, IBM Tech. Discl. Bulletin, 23(3)(1980)1260 "Method of etching undoped regions of a substrate without masking", Aug., 1980.

(List continued on next page.)

*Primary Examiner*—Charles L. Bowers, Jr.
*Assistant Examiner*—Leon Radomsky
*Attorney, Agent, or Firm*—L. E. Carnahan; Henry P. Sartorio

[57] ABSTRACT

Bulk crystalline silicon wafers are transferred after the completion of circuit fabrication to form thin films of crystalline circuitry on almost any support, such as metal, semiconductor, plastic, polymer, glass, wood, and paper. In particular, this technique is suitable to form silicon-on-insulator (SOI) wafers, whereby the devices and circuits formed exhibit superior performance after transfer due to the removal of the silicon substrate. The added cost of the transfer process to conventional silicon fabrication is insignificant. No epitaxial, lift-off, release or buried oxide layers are needed to perform the transfer of single or multiple wafers onto support members. The transfer process may be performed at temperatures of 50° C. or less, permits transparency around the circuits and does not require post-transfer patterning. Consequently, the technique opens up new avenues for the use of integrated circuit devices in high-brightness, high-resolution video-speed color displays, reduced-thickness increased-flexibility intelligent cards, flexible electronics on ultrathin support members, adhesive electronics, touch screen electronics, items requiring low weight materials, smart cards, intelligent keys for encryption systems, toys, large area circuits, flexible supports, and other applications. The added process flexibility also permits a cheap technique for increasing circuit speed of market driven technologies such as microprocessors at little added expense.

25 Claims, 28 Drawing Sheets

FOREIGN PATENT DOCUMENTS

| | | | |
|---|---|---|---|
| 63-90859 | 4/1988 | Japan . | |
| 63-55529 | 7/1988 | Japan | 437/40 TFT |
| 4-116929 | 4/1992 | Japan | 437/974 |
| WO93/15589 | 8/1993 | WIPO . | |
| WO93/16491 | 8/1993 | WIPO . | |
| WO93/18428 | 9/1993 | WIPO . | |

OTHER PUBLICATIONS

IBM Tech. Discl. Bulletin, 28(5)(1985)1855, ". . . Single Crystal Si on SiO2", Oct. 1985.

J.B. Lasky, Appl. Phys. Lett., 48(1)(1986)78, "Wafer bonding for SOI technologies", Jan. 1986.

W.P. Maszara, et al., J.Appl. Phys., 64(10)(1988)4943, "Bonding of Si wafers for SOI", Nov. 1988.

(Palik et al.) Ellipsometric Study of the Etch–Stop Mechanism in Heavily Doped Silicon, Jan. 1985, pp.135–141, J. Electrochem. Soc.

(Kloeck et al.) Study of Electrochemical Etch–Stop for High–Precision Thickness Control of Silicon Membranes, Apr. 1989, pp. 663–669, IEEE Transactions on Electron Devices, vol. 36, No. 4.

(Huster et al.) Vertically Structured Silicon Membranes by Electrochemical Etching, 1990, pp. 899–903, Sensors and Actuators, A21–A23.

(Voss et al.) Light–Controlled, Electrochemical, Anisotropic Etching of Silicon, 1991, pp. 140–143, IEEE Conference Proc.

(Reay et al.) Thermally and Electrically Isolated Single Crystal Silicon Structures in CMOS Technology, Oct. 1994, pp. 399–401, IEEE Electron Device Letters, vol. 15., No. 10.

SILICON ON INSULATOR ACHIEVED USING ELECTROCHEMICAL ETCHING

STATEMENT OF GOVERNMENT RIGHTS

The United States Government has rights in this invention pursuant to contract No. W-7405-ENG-48 between the United States Department of Energy and the University of California for the operation of Lawrence Livermore Laboratory.

BACKGROUND OF THE INVENTION

Field of the Invention

This invention relates to the transfer of bulk crystalline silicon slices (or wafers) after the completion of circuit fabrication thereon to form thin films of crystalline circuitry on arbitrary support members. In particular, this invention relates to forming silicon-on-insulator (SOI) substrates.

Achieving inexpensive thin-film silicon-on-insulator (TFSOI) has been a much sought goal in microelectronics. The many inherent advantages of TFSOI electronics include higher speed, lower power, higher integration density, and alpha particle resistance. Several different attempts have succeeded in producing TFSOI for specific applications but only with involved and expensive methods of forming the thin film. Among these are SIMOX (Separation by IMplanted OXygen), BESOI (Bond and Etchback SOI), and PACE (Plasma Assisted Chemical Etching).

In the SIMOX process, a standard silicon wafer is implanted with oxygen ions and annealed at high temperature. The oxygen and silicon combine to form a silicon dioxide layer beneath the wafer surface. To minimize wafer damage, the oxygen is sometimes implanted in two or more passes, each followed by an anneal.

The bonded wafer process starts with an oxide layer of a desired thickness (typically 0.25 to 2 microns) thermally grown on a first standard silicon wafer. The first wafer is bonded at high temperatures to a second wafer, with the oxide sandwiched therebetween. One of the wafers is ground to a thickness of a few mils using a mechanical tool. Since advanced devices require a thin silicon layer, more silicon must be removed, for example, by etching with a confined plasma.

However, these SOI and other conventional processes entail significant disadvantages: high manufacturing cost; void development between the bonded parts; reduced quality; high parasitic capacitance; alpha particle upset; large device-isolation spacing; and limited gate density.

The transfer process suffers from several problems: the use of noncrystalline silicon thin films; tile misregistration; tile wiring required subsequent to the circuit transfer; delicate handling of thin films; and the complexity of the transfer process. These problems decrease the reliability of the semiconductor manufacturing process and the resulting circuits.

A related method for fabricating semiconductor devices is described in PCT application PCT/US93/11614, entitled "Single Crystal Silicon Arrayed Devices for Projection Displays", which is incorporated herein by reference. This method utilizes large area semiconductor films, separating the films from the processing substrate and mounting them on glass or other optically transmissive materials. Films of essentially single-crystal silicon with thicknesses on the order of 2 microns or less, are separated from epitaxial substrates, and the films are mounted on glass and ceramics. Functional p-n junction devices, such as field effect transistors ("FETs") are fabricated prior to separation and transferred to glass. Bonding is used for mounting on the supports.

Another exemplary step in the semiconductor manufacture process is the thin etching of substrates, which is described in U.S. Pat. No. 5,279,703, issued to Haberger et al on Jan. 18, 1994, which is incorporated herein by reference.

Electrically relevant processes in semiconductor circuits typically take place in the uppermost region of the semiconductor crystal which has a thickness of approximately 1 µm. For mechanical reasons, it is necessary that the semiconductor crystal have a thickness of several hundred microns. Other than its function as a mechanical support, the presence of the thick semiconductor crystal material often proves to be disadvantageous. Several attempts have been made to use thin film silicon on alternative support members. One such attempt is referred to as SOS (Silicon On Sapphire), where a silicon layer is heteroepitaxially grown onto a sapphire crystal. Another attempt is the SIMOX technique described above. Yet another attempt is referred to as ZMR (Zone Melting Recrystallization) technique, whereby an amorphous or microcrystalline silicon layer is first deposited on an oxidized wafer.

Another method for manufacturing semiconductor devices is disclosed in U.S. Pat. No. 3,467,581, which is incorporated herein by reference. The semiconductor device has an electrically active region contained in a crystalline layer of semiconductor material, and the electrically active region is formed within a crystalline layer of semiconductor material epitaxially deposited on and supported by a suitable crystalline substrate. The whole substrate, and if necessary part of the crystalline layer, is removed to reduce the thickness of the crystalline layer to less than twenty micrometers.

Electrochemical etch-stop techniques are quite commonly used in the manufacture of semiconductor devices. Examples of such techniques are illustrated in the following publications, all of which are incorporated herein by reference:

(1) "Study of Electrochemical Etch-Stop for High-Precision Thickness Control of Silicon Membranes", by Ben Kloek et al., IEEE Transactions on Electron Devices, VOL. 36, No. 4, April 1989, pages 663–669.

(2) "Ellipsometric Study of the Etch-Stop Mechanism in Heavily Doped Silicon", by E. D. Palik et al., Journal of the Electrochemical Society, January 1985, pages 135–141.

(3) "Vertically Structured Silicon Membranes by Electrochemical Etching", by R. Huster et al., Sensors and Actuators, A21–A23, 1990, pages 899–903.

(4) "Light-Controlled, Electrochemical, Anisotropic Etching of Silicon", by R. Voss et al., German Aerospace/MBB GmbH, 1990, pages 140–143.

(5) "Thermally and electrically isolated single crystal silicon structures in CMOS technology", by Reay, R. J., Klaassen, E. H.; Kovacs, G. T. A., IEEE Electron Device Letters (October 1994) vol. 15, no. 10, p. 399–401.

Many of these conventional electrochemical etch-stop techniques use relatively thick membranes (greater than about 10 microns). These also use epitaxy, which adds cost and complexity, and require electrical contacts to both the substrate and to the epitaxial layer. The etching apparatus used in their setups is cumbersome and the sample preparation is lengthy. Samples usually require protective jackets. In general, these references only generate mechanical structures and do not contain electronic devices.

Continuous efforts are currently being expended worldwide to pack the electronic circuits in as small a volume as possible. PCT application PCT/US93/01322, entitled "High Density Electronic Circuit Modules", which is incorporated herein by reference, describes a method for fabricating complex hybrid multi-function circuitry on a common module body by using silicon thin film transfer processes to dice files of circuits formed in silicon thin-films, and tiling the removed tiles to a common module body. The films may be formed of amorphous silicon (a-Si), polysilicon (p-Si), or "essentially" single-crystal silicon (x-Si) depending upon the desired circuit parameters. Elements of one circuit are interconnected to elements of another circuit by photolithographically patterned thin film metallization techniques.

The principle disadvantage of these techniques is the use of x-Si (essentially single crystal silicon), requiring extensive experience with hot-wire recrystallization. Since x-Si contains more defects than crystalline silicon (c-Si) it is much more desirable to use standard crystalline silicon wafers and technology requiring well-known manufacturing techniques.

Flat-panel liquid-crystal displays (LCD) and technology are currently being developed and are expected to eventually supplant cathode ray tube (CRT) technology and provide a more highly defined television picture. Flat panel displays employing LCD's generally include five different layers: a white light source, a first polarizing filter that is mounted on one side of a circuit panel on which thin-film transistors (TFTs) and interconnects are arrayed to form pixels, a liquid crystal layer, a filter plate containing at least three primary colors arranged into pixels, and a second polarizing filter.

One exemplary conventional approach to TFT formation for flat panel displays employs amorphous silicon (a-Si), which compromises certain aspects of the panel performance. For example, a-Si TFT's lack the frequency response needed for large area displays due to the low electron mobility in amorphous material. Thus, the use of amorphous silicon is unsuitable for the fast logic needed in the driver logic to drive the display, but is usually adequate to perform as pixel devices.

One attempt to form high quality TFT's at the pixels in the driver circuits of a panel display is illustrated in U.S. Pat. No. 5,206,749, issued on Apr. 27, 1993 to Zavracky et al., entitled "Liquid Crystal Display Having Essentially Single Crystal Transistor Pixels and Driving Circuits", which is incorporated herein by reference.

A related method for fabricating displays is also described in PCT patent application number PCT/US93/11614. However, owing to the limitation of recrystallized silicon, or "essentially" single crystal, the number of defects is still relatively high, thus limiting the feature size of the transistors, and the ability to minimize pixel area, and reducing yield. Additionally, the thin film separated from the substrate requires delicate and special handling, and the separation process is a lengthy process, particularly when the area to be separated is large.

Therefore, it is highly desirable to have a new liquid crystal display, wherein the active devices or transistors used in the manufacture of the liquid crystal display are processed using bulk crystalline wafers having a relatively low number of defects. Since all of the circuit processing occurs prior to transfer there is no need for separation of the display circuits followed by reconstructing since the entire display is transferred at once.

Application PCT/US93/02312 illustrates an electroluminescent (EL) or an active matrix liquid crystal display (AMLCD) head mounted display. This display comprises thin film transistor (TFT) driving elements formed of single crystal silicon and transferred to a transparent glass support. Each TFT circuit is connected to an electrode which defines a picture element (pixel) of the display. The head mounted display system also includes a detector array comprising thin film integrated optical diode detectors formed of III–V materials and transferred directly onto a flat panel active matrix display.

Therefore, it is highly desirable to develop head-mounted display systems which incorporate bulk crystalline silicon technology, eliminate the double transfer, and do not require registration or post assembly metallization and patterning. Furthermore, it is desirable to implement the crystalline silicon technology without resorting to an expensive SOI technology but rather implement standard bulk silicon processing.

SUMMARY OF THE INVENTION

It is an object of the invention to provide a new semiconductor manufacturing process and devices produced thereby, wherein the manufacturing process significantly alleviates the problems associated with conventional transfer processes, further increases the production yield and reliability, uses crystalline silicon devices rather than essentially single crystal, and permits the use of wafers fabricated in a standard silicon wafer fabrication line.

It is an additional object of the invention to provide a new liquid crystal display wherein the active devices or transistors used in the manufacture of the liquid crystal display are formed from crystalline silicon wafers.

The main feature of this invention is a manufacturing process for forming thin film crystalline silicon circuits on arbitrary supports. The approach of this invention is to take silicon wafers with completed circuits, bond the circuit-side of the wafer to the support, thin the wafer to remove excess silicon, and finally to use a electrochemically enhanced etching to define the circuits and expose the electrical contact regions which obviates the need for further patterning steps on the bonded pair in a silicon foundry where the introduction of supports such as glass or plastic is not This manufacturing process presents several advantages, including:

1. It is possible to form regions containing circuits or devices using standard well proven manufacturing techniques. There is no need for post-transfer patterning.
2. A simple and inexpensive technique for transferring bulk crystalline silicon (c-Si) wafers with completed circuitry to alternative supports is provided. This may be achieved without additional process alterations on the part of the silicon foundry producing the wafers, and avoids the re-introduction of the sample into a clean-room facility after having been exposed to steps which would otherwise demand rigorous cleaning.
3. The circuits or devices operate at higher speeds, since the parasitic interconnection capacitance to the substrate is substantially eliminated by the transfer process.

The power consumed in a circuit is conventionally given by the following equation:

$$P = f C V^2$$

where P is the power consumed by the integrated circuit; C is the circuit capacitance, i.e., the combination of device and interconnect capacitance; f is the operating frequency (i.e., 50 Hz); and V is the battery voltage. For instance, by eliminating the interconnection capacitance, the capacitance reduction might amount to 20%, in which case the power consumed is also reduced by 20%. For the same example and a given battery voltage, the power source (i.e., battery) lasts longer or it is possible to increase the frequency, i.e., operate the circuit at higher speeds.

4. Electrical isolation between circuit regions provides additional assurance that the individual circuits and devices do not interfere with each other.
5. The transfer process may be carried out at temperatures which do not exceed 50° C., thus enabling the use of a very wide variety of supports such as glass, metals, plastics, ceramics, wood, and paper.
6. The entire silicon wafer may be peeled to provide transparency around the circuits. In one particular embodiment, the circuits may be transferred onto a transparent support such as glass, thus allowing light to be transmitted around the circuits where the silicon substrate has been removed. This transparency feature can be exploited in the manufacture of displays.
7. The transfer process does not require epitaxy. This is a distinct advantage over BESOI since no epitaxial etch stop is required and therefore the circuits may be formed prior to transfer. Conventional bond and etch back methods to achieve silicon-on-insulator use epitaxial layers as physical etch stops. Furthermore, all of the circuit processing occurs after the thin-film formation and not prior thereto. The epitaxy increases the manufacturing cost, complexity, and defects of the bonded wafer process.

In addition, no laser or hot-wire recrystallized layers or release layers are required in the transfer process. Thus, conventionally fabricated silicon wafers from silicon foundries may be employed which is a substantial advantage over other prior art.

8. In display applications it is possible to electrically test all of the display circuitry prior to transfer to the display support. If the circuit fails to perform or redundancy strategies also fail, the circuit may be rejected and the expense of further processing avoided. Secondly, circuit functionality is ensured by forming the entire interconnected circuit, including pixel transistors, drive circuitry and interface electronics on the silicon wafer. Standard silicon repair techniques may be used to determine fault locations during electrical testing and appropriate measures taken to circumvent them such as laser repair of opens and shorts, laser selection of circuits etc. Thirdly, the use of silicon transistors of small dimensions, which is standard bulk silicon processing permits and which is not possible for hot-wire recrystallized material, enables the use of multiple transistors at each pixel location. This not only allows for greater flexibility in pixel design but also permits the use of transistor redundancy at the silicon wafer level. Thus, it is possible to guarantee pixel and electronics performance prior to transfer to the display support member, facilitating higher yields.

The present invention facilitates silicon processing as the feature size, the minimum dimension on a microelectronic component, decreases. The transfer process allows for: the substantial reduction of interconnect parasitic capacitance and therefore an increase in circuit speed; a significant increase in interconnect density by permitting a second series of interconnects on the "reverse" side of the circuitry after the transfer, an important extra degree of freedom as the device dimensions decrease; the elimination of the possibility of electrical interference between devices; essentially "air-gap" isolation which is superior to other isolation technologies such as LOCOS (local oxidation of silicon), resulting in a higher density of devices by reducing the spacing between them.

DETAILED DESCRIPTION OF THE PREFERRED EMBODIMENTS

MANUFACTURE OF SEMICONDUCTOR DEVICES

The main feature of this invention is a manufacturing process for forming thin film crystalline silicon circuits on arbitrary supports. The invention takes a silicon wafer with completed circuits, bonds the circuit-side of the wafer to the support, thins the wafer to remove excess silicon, and finally uses a silicon region formation technique to define the circuits and expose the electrical contact regions which obviates the need for further patterning steps on the bonded pair in a silicon foundry where the introduction of supports such as glass or plastic are not permitted. The manufacturing process according to the present invention generally includes four basic stages: the preparation stage, the bonding stage, the thinning stage and the silicon region formation stage.

Preparation Stage

Figure 1A:
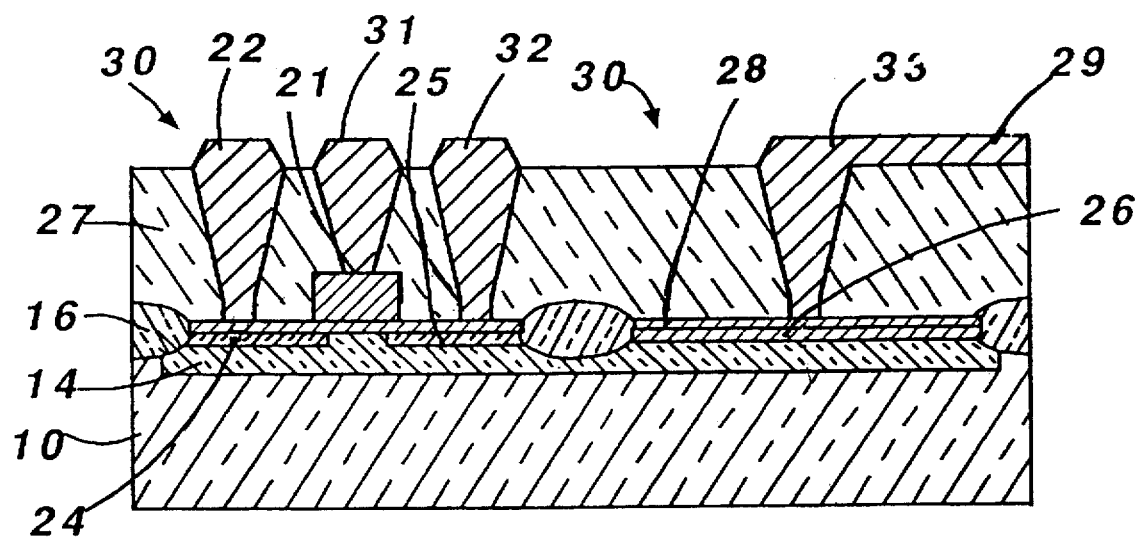
FIG. 1A is a cross-section of a MOS transistor and FIG. 1B is a simplified representation thereof.
Figure 1B:
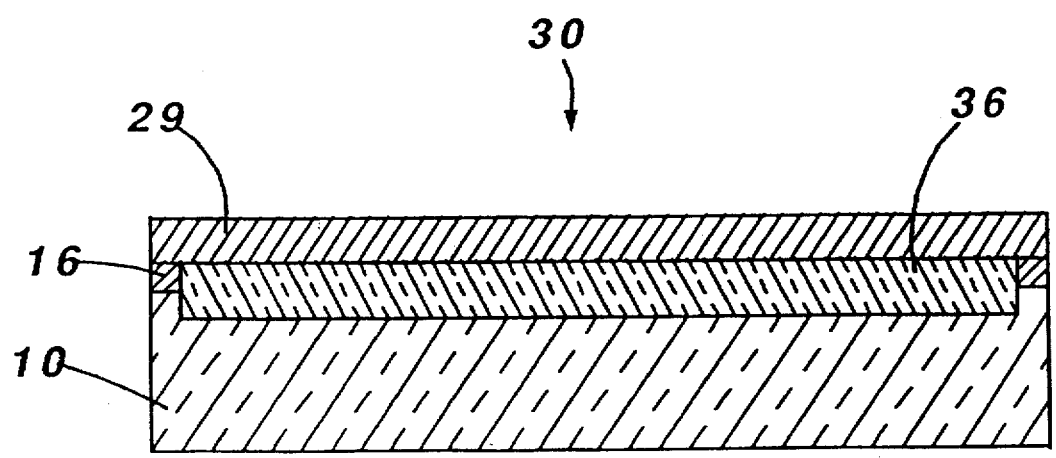

The circuits are formed by conventional methods. FIG. 1A illustrates the schematic cross section of a standard metal-oxide-semiconductor MOS transistor 30. Silicon wafer 10 has conductivity type 1, in this example an n-type wafer. A patterned well 14 is implanted having conductivity type 2, in this example p-type, within the silicon wafer 10. The well 14 is usually lightly doped, less than $1\times10^{18}/cm^3$ to facilitate the operation of metal-oxide-semiconductor (MOS) devices. The well 14 is diffused and the dopant activated. In this example, the depth of the well 14 is typically greater than 0.5 microns. Field oxide layer 16 is formed through a process generally known as LOCOS (local oxidation of silicon). A gate oxide layer 28 is thermally grown, or deposited, and patterned over the well 14. In the present example, the gate oxide layer 28 has a thickness of about 400 Angstroms. The gate 21 of the transistor 30 is usually doped polysilicon, while the source 24 and drain 25 are implanted with dopant of type 1, which is diffused and activated. A well contact region 26 is implanted with dopant of type 2 followed by diffusion and activation. A metal layer 29 is deposited and patterned on the oxide layer 27, and fills the contact holes, in order to provide electrically conductive paths 22, 31, 32 and 33 to the source, gate, drain and well contact regions 24, 21, 25 and 26, respectively. FIG. 1B is a simplified representation of the semiconductor device 30, showing the substrate 10, the field oxide layer 16, the region or circuit cell 36 which contains all the detailed features of FIG. 1A, and the metal layer 29.

Bonding Stage

Figure 2A:
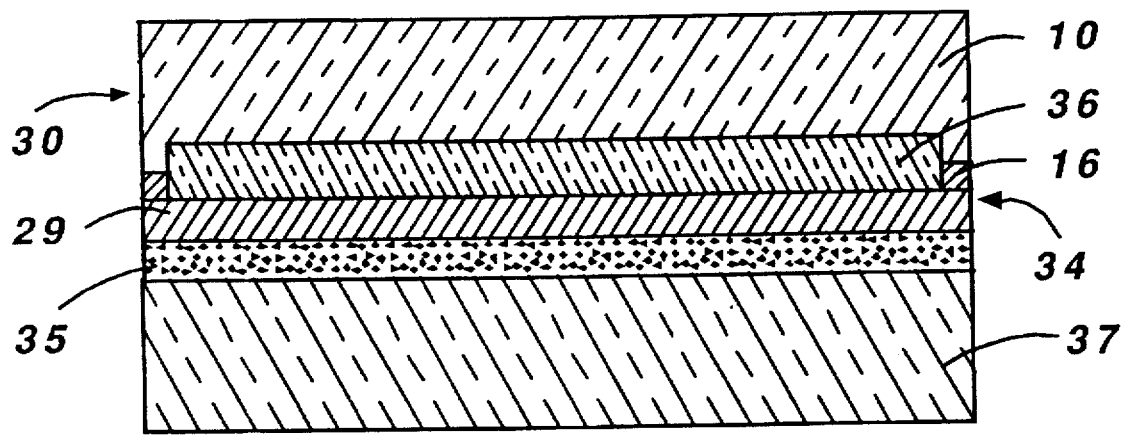
FIGS. 2A–D illustrate a bonding stage.

FIG. 2A illustrates the optional bonding stage of the process. The entire surface of the metal layer 29, of the device 30 of FIG. 1B, is coated with a suitable adhesive layer 35 to form a member 34. The member 34 is inverted and secured to a desired support member 37. Various types of support members may be used, for instance, glass, ceramics, plastic, metal, wood, paper. Any suitable bonding technique can be used. Depending on the adhesive 35, the foregoing bonding steps can be carried out at room temperature.

A suitable adhesive can be a thermosetting plastic, or a UV curable epoxy which can be spun on the silicon wafer containing transistor 30. When the silicon wafer is attached to the support member 37, the air bubbles within the adhesive layer 35 may be removed by placing the sample 34 and attached support 37 in vacuum and/or baking it. The UV epoxy preferably has a relatively low viscosity (less than about 1000 cps) to permit vacuum removal of the air bubbles. UV curable epoxy is suitable when the support member is transparent to ultraviolet rays.

Figure 2B:
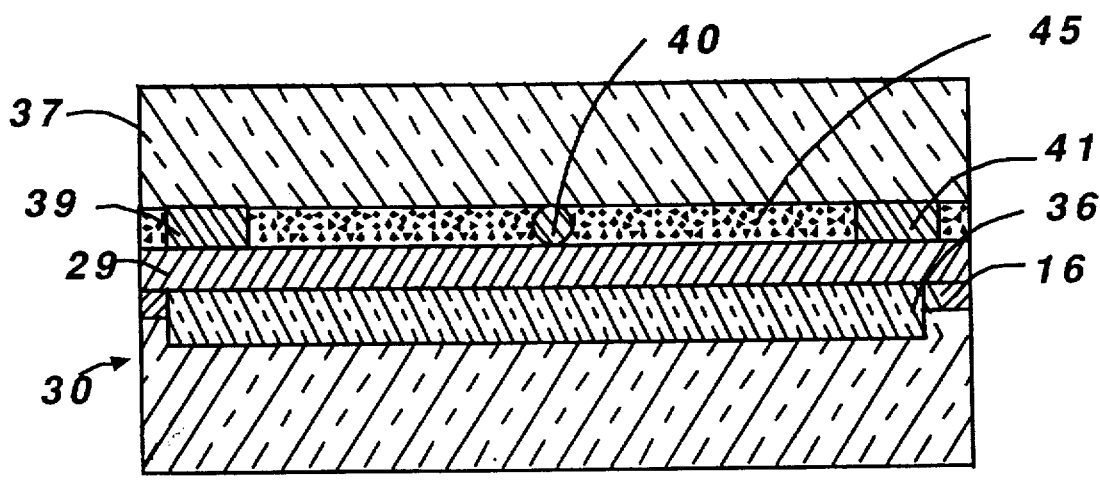

Alternatively, the silicon wafer is held at a fixed but small distance from the support member and the adhesive is drawn into the gap using vacuum or capillary action. As shown in FIG. 2B, the support member 37 and the device 30 are brought into close proximity but held apart at a small distance by solid spacers or shims 39, 40, 41. These solid spacers may be made of any suitable solid material, such as metal spacers 39, 41, and glass or plastic spherical spacers 40. If the support 37 and the silicon wafer are sufficiently flat, gaps as small as 1–2 microns can be formed, although gaps for liquid-crystal displays typically vary between 5 and 10 microns. Adhesive 45 is induced into these gaps through capillary action, by providing a source of the adhesive at the edge of the gap.

Figure 2C:
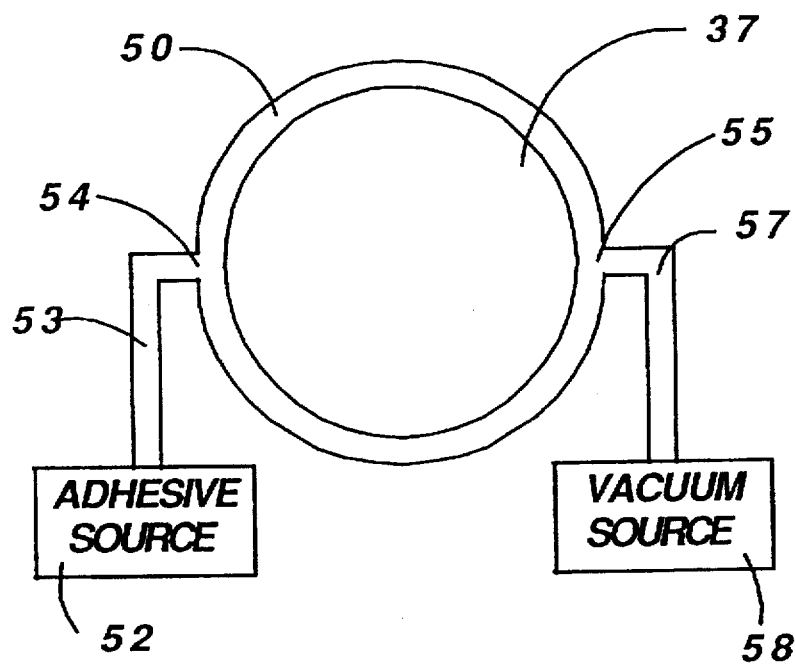

Adhesive draw may be assisted through vacuum pulling as shown in FIG. 2C. A seal 50 is provided around the coupled support member 37 and device 30, allowing for the entrance of adhesive from a source 52, through a connecting link 53, via an entrance hole 54. Vacuum may be provided to assist in drawing the adhesive 45, via an exit hole 55, through a connecting link 57, towards a vacuum source 58.

In an exemplary process of capillary draw, without vacuum assistance, a UV curable epoxy was selected for bonding the silicon wafer to the support member. For optimum adhesive distribution in the gap between assembled parts, careful attention is paid to a number of details of the process to achieve uniform movement of the glue and to avoid bubble formation. Some of these are temperature, adhesive viscosity, surface topography, cleanliness and preparation, surface materials, use of vacuum and part shape. The most desirable glue motion is a uniform-velocity straight-front across the gap. In many cases this may not be perfectly achievable but with a suitable adjustment of the application conditions a close approximation is possible. The temperature of assembled parts strongly affects the viscosity of conventional adhesives. As temperature increases, most adhesives decrease in viscosity. This may be advantageous for rapid distribution of the adhesive throughout the gap. However, this may not be good if the glue capillary velocity also varies across different surfaces in which case it decelerates over one and accelerates over another, eventually causing bubble formation. A small gap, typically less than 10 microns, in combination with topographical variation has a profound effect on glue motion, since velocity increases in narrow-space areas and decreases in wide-space areas. Planarity on the support member is usually easier to achieve than on the silicon substrate surface. Glue motion is also faster at gap edges than in the gap body. This may be overcome by applying the adhesive to a small section of the gap and allowing it to spread evenly while drawing itself forward at the edges. Part cleanliness also affects glue motion. Dust picked up by the moving front is visible and can be seen swept along with the front, provided the support member is transparent. This may result in dust deposition in undesirable locations. The use of vacuum may aid both the glue motion as well as forcing the assembly together to maintain a precise gap. Part shape adversely affects glue distribution if there are corners and care must be taken to ensure that bubbles do not form in these areas. Good results have been achieved with disk-like parts such as silicon wafers.

Another important consideration is glue quality. It should be filtered to ensure there are no trapped particles. For example, an electronic-grade 0.2 micron filterization is appropriate. In electronic circuits the presence of alkalis, and especially sodium, the most mobile diffuser of these, can reduce device reliability should the alkali penetrate as far as the transistors. Alternatively the presence of mobile ions in the glue can alter transistor performance through image-charge-induced conductive paths in the silicon. Thus, it is advisable to distill or filter the glue to reduce alkali content to sub-ppm levels, and complete silicon wafer fabrication with a PECVD dielectric layer such as silicon nitride to prevent ion penetration. To prevent electrical interference it is appropriate to interpose a metal layer between the glue and the circuits without necessitating the removal of the alkali from the glue.

Figure 2D:
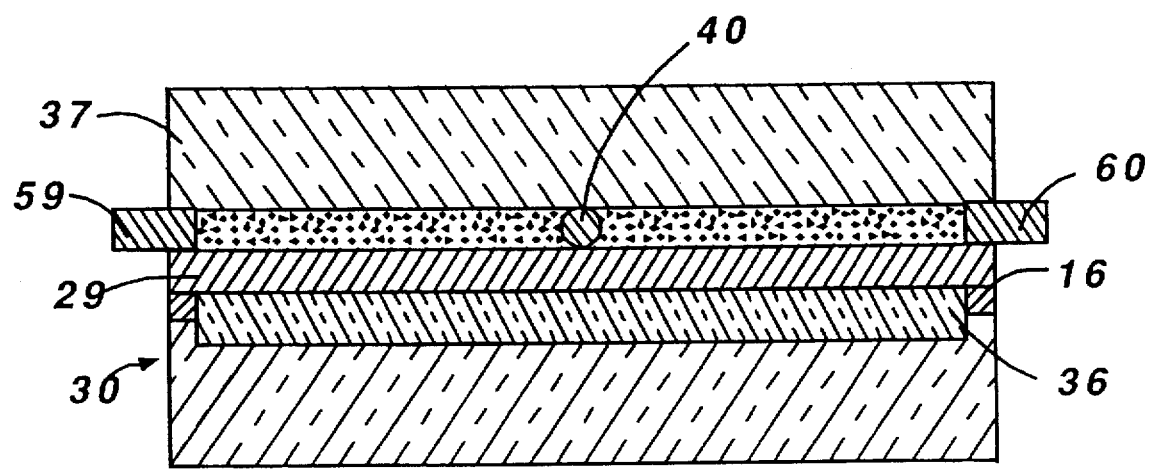

FIG. 2D illustrates an additional scheme which is useful during some of the subsequent etching steps. Outwardly protruding metal straps 59, 60 are placed between the support member 37 and the device 30, in order to provide electrical contact to the metal layer 29 via epoxying, soldering, bonding or simply pressing of the metal straps between the support members 37 and the device 30. It is also possible to provide a plurality of spacers, such as the spacer 40, in order to determine the gap distance between the support member 37 and the device 30.

Thinning Stage

Figure 3A:
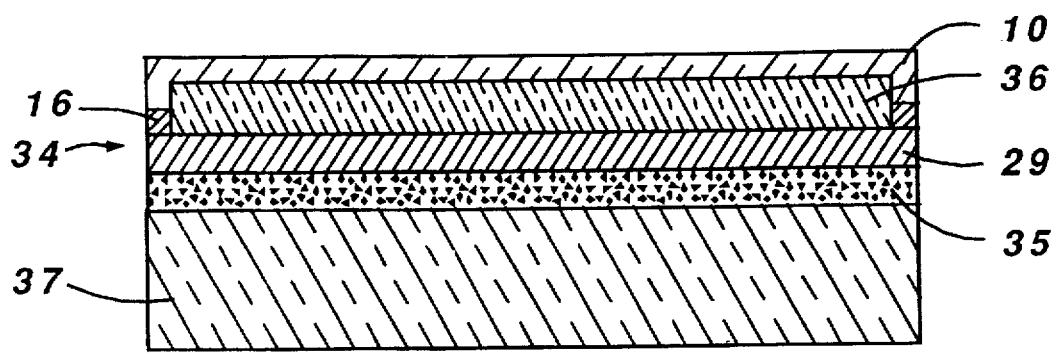
FIGS. 3A–C illustrate a thinning stage.

In FIG. 3A, the silicon wafer 10 is thinned to a desired thickness by means of well known techniques, such as plasma etching, wet etching, electrochemical etching, grinding, chemical-mechanical polishing or a combination thereof. An exemplary final thickness of the silicon wafer is about 10 microns.

Figure 3B:
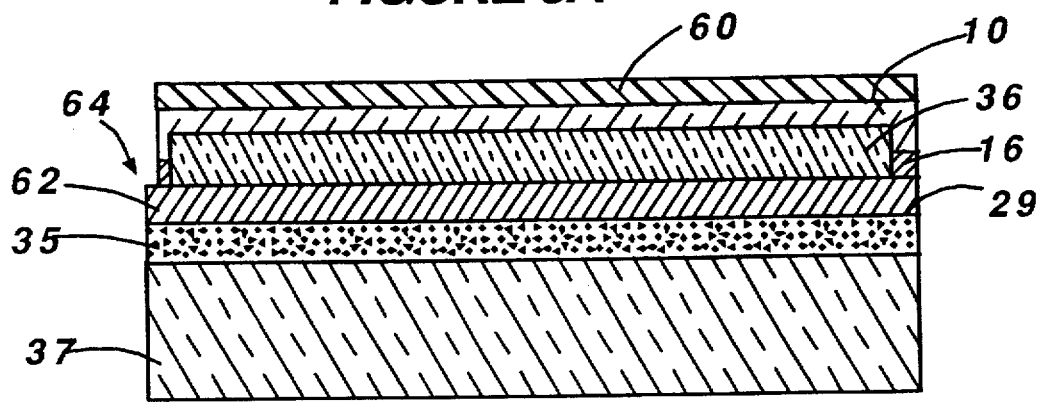

Electrical access to the metal layer 29 is required for the subsequent etching steps. One method is shown in FIG. 3B where a cover or mask 60 is placed over substantially the entire surface area of the remaining silicon wafer 10. The cover 60 may be made of any material suitable to withstand plasma etch, such as metal, plastic or glass. The cover 60 is shaped such that it exposes the region of interest, which, when etched, exposes an edge 62 of the metal layer 29. The metal exposed as a result of this etch provides electrical contact to the silicon regions of interest on the wafer front surface. For this purpose, the exposed silicon region forming part of the silicon substrate 10 and the underlying field oxide region 16 using known techniques, for example, plasma etch with $SF_6$ gas, to expose the edge 62. For simplicity, the device 64 shown in FIG. 3B, without the mask 60, is hereinafter referred to as the "fast product".

Figure 3C:
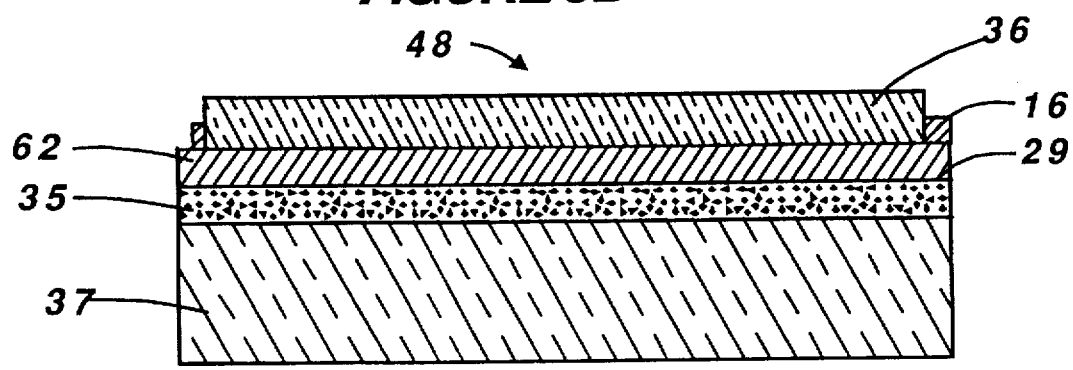

In FIG. 3C, the cover 60 is removed, and the silicon layer 10 is completely removed using, for example, electrochemical etching as explained in detail below, exposing the field oxide 16 and leaving the silicon region 36 intact. In an optional step in the thinning stage, the metal layer 29 is exposed for probing, and externally connecting to the enclosed circuitry, by removing all or selected portions of the field oxide layer 16. The field oxide 16 may be removed using dry plasma etch, for example $CHF_3$ and $O_2$ which, under conventional plasma conditions, is selective over silicon and metal, or a wet chemical etch which is also selective to silicon and metal, such as commercially available mixtures of via etch. The resulting device is hereinafter referred to as the "intermediate product" 48.

Silicon Region Formation Stage

Figure 4:
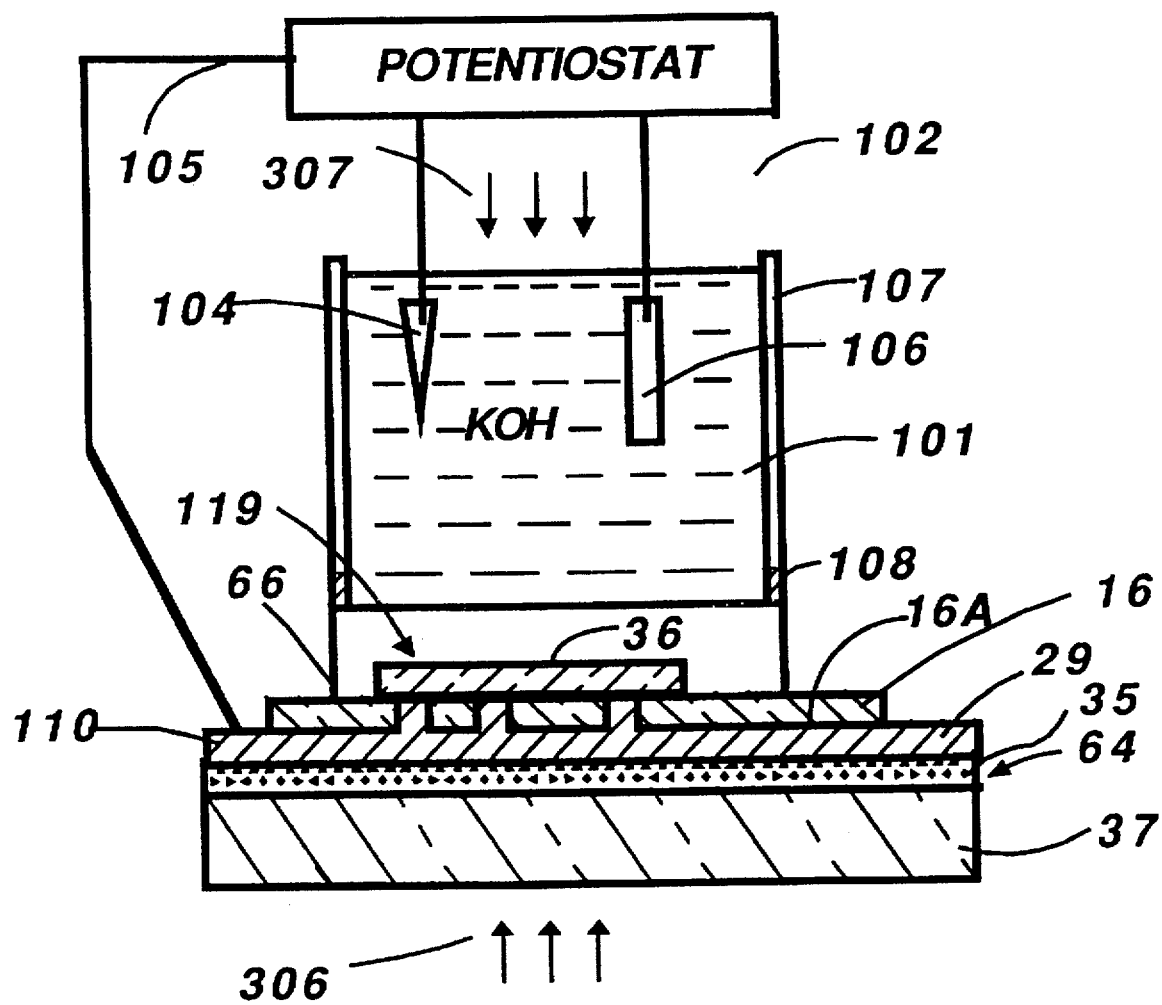
FIG. 4 illustrates an exemplary electrochemical etch configuration.

FIG. 4 illustrates an exemplary electrochemical etch configuration according to the present invention. A bath of 3:1 KOH (potassium hydroxide) aqueous solution 101 forms a column of electrolyte. Among other possible electrolytes are hydrazine, ethylene-diamine pyrocatechol (EDP), sodium hydroxide, trimethyl ammonium hydroxide (TMAOH) and hydroflouric acid (HF). Alternatively, etchant-concentration variations or mixtures may be employed. The temperature of the solution 101 typically ranges between 30° C. and 85° C. for KOH, and between 50° C. and 115° C. for EDP. The etch configuration further includes a conventional potentiostat 102 and three electrodes: a reference electrode 104 which is preferably a saturated calomel electrode, a working electrode 105 and a counter electrode 106. Under some circumstances it may also be possible to do away with the reference electrode and have a two electrode system. The electrolyte 101 resides within a container 107, which may be of any suitable etch-resistant material such as glass, teflon, or stainless steel. A seal 108, such as an etch-resistant rubber derivative, is formed between the container 107 and the intermediate product 48. However the first product 64, which has not received any of the intermediate thinning steps may also be etched.

In an exemplary mode, the counter electrode is made of copper. Other suitable materials, such as platinum or gold can also be used. The working electrode 105 is connected to an edge 110 of the metal layer 29 of the first product 64, for example by a crocodile clip. The applied voltage slightly reverse-biases the pn junctions and stops the etch once the junction is reached by the etchant. If the first product 64 includes multiple regions (as described later), the metal layer 29 is connected to all of these regions to provide the etch-stop feature. The silicon bulk is electrically floating but its potential is determined by the working electrode potential and the other parameters of the process such as electrolyte concentration, temperature, and counter electrode material. Silicon etches until everything except the wells are removed, thereby exposing the field oxide 16. The electrolyte etches silicon dioxide at a slow rate, typically less than 100 Å/minute, thus leaving a protective coating over the metal interconnections which would otherwise be etched by the electrolyte. Thus, it is possible to control the selective etching of desired silicon regions. As a result, the circuits formed within the silicon region 36 remain unaffected, leaving the final product 119.

One aspect of the present invention is the silicon region formation which permits the sequential self-formation of silicon regions accompanied by the elimination of the surrounding silicon in the same step. The electrical junctions between silicon regions of opposite conductivity types determine the boundaries of the regions. By providing electrical contacts only to the region of interest, using just one working electrode, and by performing silicon region formation, no contact holes are exposed to the etchant. As a result, the silicon region formation dispenses with the need for a second working electrode connection to the silicon wafer, thereby simplifying the etch process and achieving the desired result. Furthermore, there is no need to perform further patterning on the wafer since access to electrical connections is achieved by a dip of the sample in oxide etching solution. Thus, is is not necessary to reintroduce the sample to a silicon clean room facility which is one of the key features of this invention.

Figure 5:
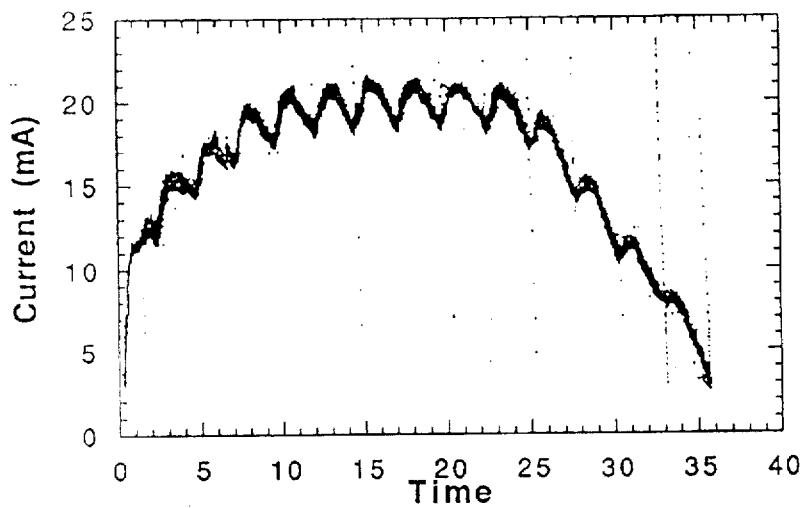
FIG. 5 is an experimental graph showing an example of endpoint detection.

Yet another important feature of the substrate removal process is that endpoint may easily be monitored by observing the flow of current through the sample and electrolyte, to determine the optimal time at which the silicon regions have been isolated and defined. Endpoint is usually detected as a drop in current related to the complete removal of the silicon substrate. The remaining current supplies the continuing anodization processes. The endpoint for etching is an important parameter for process control and manufacturing considerations. FIG. 5 shows an example of endpoint detection performed on a silicon sample 1 inch in diameter, at about 70 C. The initial portion of the curve shows the current monotonically increasing while the sample is ramping up to the final temperature. The current flow is accompanied by vigorous hydrogen evolution when etching with KOH. As the temperature stabilizes, the average current reaches about 20 mA. The oscillation seen in the curve is an artifact of the heater supply switching on and off. The final endpoint current is dependent on the silicon surface area remaining which in turn is dependent on the original well design on the silicon surface. The endpoint may be selected when the current reaches an appropriate fraction of the maximum current, in this case about 10%. The final current is approximately determined by the ratio of remaining-to-removed silicon area. The electrically measured current ratio may not correspond exactly to the designed well area ratio since the silicon regions have edges which contribute to the current level. It should be noted that the silicon region formation stage can be automated and computer controlled.

In conventional processes, such as that described in U.S. Pat. No. 3,467,581 to Mash, in which an epitaxial layer covers the entire wafer, a large area uniform silicon thin film remains after the completion of the electrochemical etch, which requires significant additional processing to achieve the same end-point as the silicon region formation of the present invention.

Figure 6A:
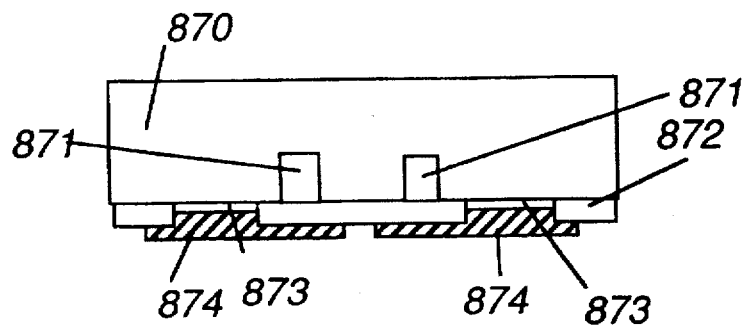
FIG. 6A shows an exemplary configuration on a silicon wafer.
Figure 6B:
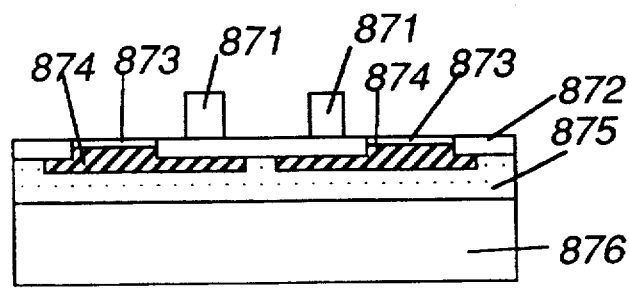
FIG. 6B shows the exemplary configuration of FIG. 6A. after transfer and silicon region formation, to a support member.

One of the advantages of this invention is the ease with which the metal wiring may be accessed for probing and wire bonding without requiring a patterning step after silicon region formation. In bulk crystalline silicon processing, a silicon dioxide layer is conventionally used to isolate conductors as well as to implement regions of higher threshold voltage between active devices. For MOS devices, several different thicknesses of silicon dioxide may be present in the same device. This feature may be used to implement access to the conductors leading to the circuitry which lays buried under an oxide layer after transfer. FIG. 6A shows conventional bulk crystalline silicon regions 871 in a silicon wafer 870. Regions 871 may contain one or more electronic devices such as resistors, capacitors, diodes, transistors, subcircuits, and entire circuits. Thermal oxide 872 isolates these devices from their surroundings. Thin oxide regions 873 are introduced prior to deposition and patterning of metal layer 874. The situation after transfer is depicted in FIG. 6B, in which the thin layer of crystalline material is adhered via glue 875 to support member 876. Conductors 874 are buried beneath oxide layer 872 and 873. Since the oxide 873 is thinner than oxide 872, a wet etch, for example, a dilute hydrofluoric acid, may be used to expose the metal layers 874 for electrical probing or wire bonding. Since layer 872 is thicker it protects the remaining conductors.

The exemplary method requires only one connection to the wells whereas conventional electrochemical etching requires two connections to the silicon wafer on either side of the junction to provide an etch stopping mechanism. The conventional electrochemical technique is often applied to etching windows or diaphragms in the silicon wafer from the backside, requiring extra backside masking steps, and it retains a significant area of wafer-thick silicon. This wafer-thick silicon is required to protect contact regions and to provide mechanical support. Only one junction type (n or p) is employed. Because of the silicon retention the final product remains impervious to light transmission. Retaining the silicon results in no improvement in circuit speed and no additional isolation of the circuits or devices contained in the silicon film. Furthermore, the methodology for attaching the wiring to the silicon wafer is cumbersome and requires extensive wafer handling and an etch resistant jacket for each wafer.

The transferred circuits form thin films of electronics on arbitrary supports and are called circuit panels. The removal of the substrate allows for: the substantial reduction of interconnect parasitic capacitance and therefore an increase in circuit speed; a significant increase in interconnect density by permitting a second series of interconnects on the "reverse" side of the circuitry after the transfer, an important extra degree of freedom as the device dimensions decrease; eliminates the possibility of electrical interference between devices, thus avoiding a thorny issue in device design; and provides essentially "air-gap" isolation and is superior to other isolation technologies conventionally employed such as LOCOS (local oxidation of silicon) resulting in a higher density of devices permitting the reduction of the spacing between them.

Multiple-Region Formation

Figure 7A:
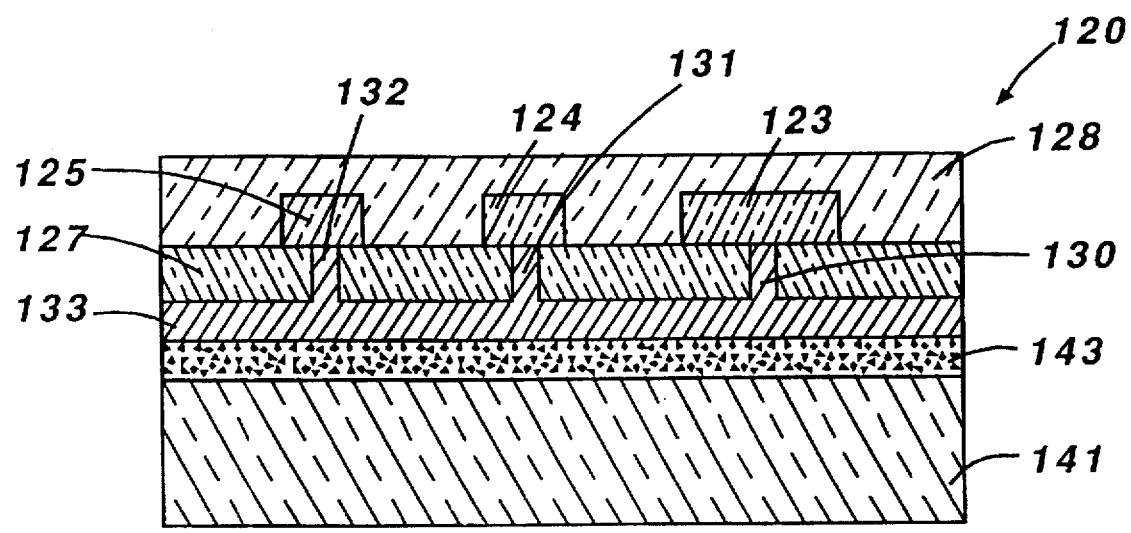
FIGS. 7A–C illustrate a method of forming multiple regions.

The foregoing manufacturing process can be extended to form multiple regions. FIG. 7A shows a sample 120 which includes multiple wells 123, 124 and 125 disposed in a silicon wafer 128. A silicon dioxide layer 127 is formed and patterned over the wells 123, 124 and 125 to provide contact holes 130, 131 and 132, respectively. A metal layer 133 is deposited on the silicon dioxide layer 127 to form an electrical contact to the wells 123, 124 and 125, through the corresponding contact holes 130, 131 and 132. The silicon wafer 128 and the support member 141 are bonded using an adhesive layer 143 according to the foregoing techniques. The silicon wafer 128 is then thinned and removed to form and isolate the multiple regions 123, 124 and 125. In this way multiple regions can be simultaneously formed on the same support member 141.

Figure 7B:
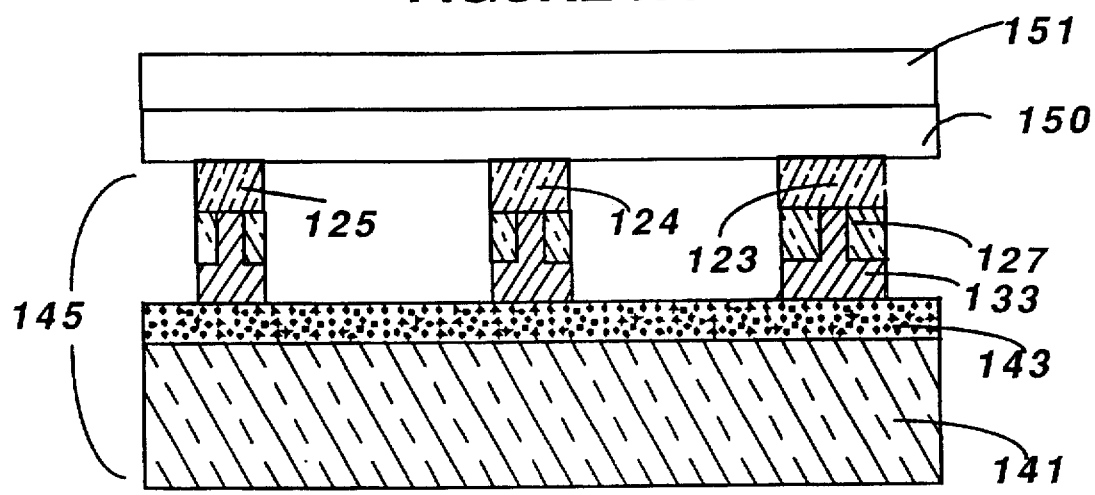

As shown in FIG. 7B, the regions 123, 124, and 125 may be further isolated by continuing the etch of the oxide layer 127 and metal layer 133, where the etch may be masked by the silicon regions, leaving the isolated regions 123, 124 and 125 adhering to the support member 141 via the adhesive layer 143. By judicious selection of adhesive and support material it is possible to stretch the adhesive layer 143 and the support 141 in two dimensions to increase the area of the support. In this case, additional processing may be performed to provide interconnecting metallization between regions to form circuits.

Figure 7C:
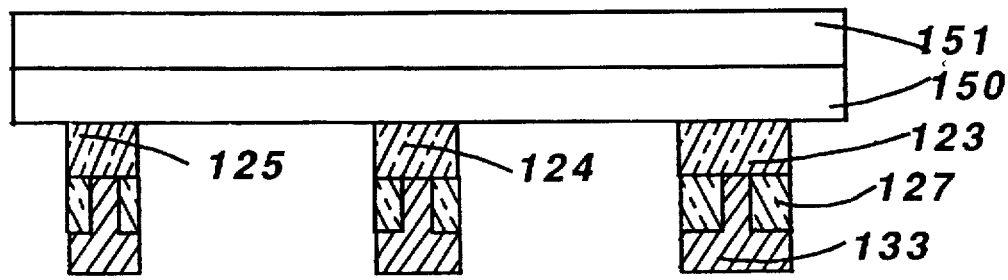

Optionally, after stretching, it is possible to attach the product 145, before or after the interconnect processing, via an adhesive layer 150 to another support member 151. A liquid selective etch is introduced between the regions to remove or dissolve the adhesive layer 143, thus separating the regions 123, 124, 125, 133 and 127 from the support member 141, as illustrated in FIG. 7C. For such applications, the adhesive layer 143 is properly selected as a non-permanent bonding agent, and the support member 141 is used as a mechanical support to prevent damage to the regions 123, 124 and 125. The support member 151 can be any suitable material, for example, glass, for use in SOI electronics with some possible circuit applications being microprocessors, memories, flat-panel displays, and opto-electronic applications.

Alternatively, the support member 151 can be a sheet of thin plastic for use in flexible electronics, items requiring low weight materials, light weight materials such as plastics, credit cards, smart cards, intelligent keys for encryption systems, toys, large area circuits in which a small circuit is elongated in two dimensions on a stretchable or flexible support adapted to fit the required shape such as curved surface sunglasses, adhesive tape, adhesive electronics where the circuit has an adhesive backing suitable for RF identification, labeling, electronically reprogrammable "bar code like" labels, and cut and paste electronics.

Multiple-Region-Type Formation

Figure 8:
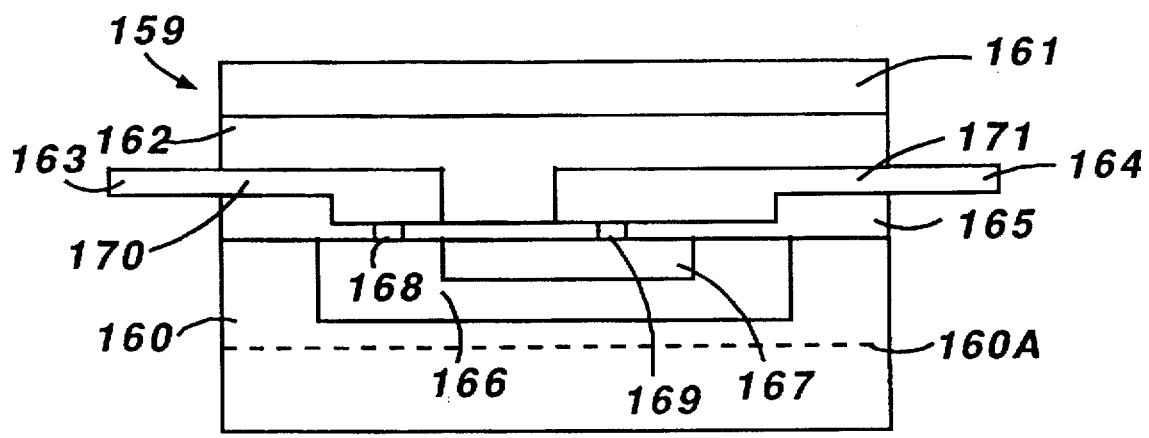
FIG. 8 illustrates sequential etching to establish a region of conductivity type 1 containing a region of conductivity type 2, followed by the removal of the region of conductivity type 2 to form a region of conductiviy type 1 only, in a single electrochemical etch.

FIG. 8 illustrates a formation of multiple regions of different conductivity types in a single electrochemical etch. In summary, a well inside a region itself becomes the region, by the removal of the outer layer.

A sample 159 includes a silicon wafer 160, of conductivity type 1 provided with a well 167 of conductivity type 2 completely enclosed in a well 166 of conductivity type 1. An oxide layer 165 covers the wafer 160, and two metal layers 170 and 171 contact the wells 166 and 167 through two contact holes 168 and 169, respectively. Metal straps 163 and 164 make physical and electrical contact with metal layers 170 and 171, and protrude outwardly to provide electrical conductive paths to the wells 166 and 167. The contact holes 168, 169 may be filled with copper, gold or tungsten or another suitable material which resists the later exposure to the etchant, and which protects the metal layers 170, 171, and the metal straps 163 and 164 by preventing penetration of the etchant through the contact holes 168, and 169. A support member 161 is bonded to the wafer 160 by means of an adhesive layer 162. The dashed line 169A represents the thickness of the silicon wafer 160 after thinning. The sample 159 is inserted in the electrochemical etch apparatus shown in FIG. 4. The working electrode 105 (FIG. 4) is connected to the metal strap 163 and biased to the appropriate potential. The metal strap 164 may also be connected to the metal strap 163 or left unconnected.

The silicon substrate 160 is entirely removed, leaving the silicon well 166, which has become a region, remaining with the oxide layer 165 exposed wherever the region 166 does not extend. After the completion of the first etch, the removal of the region 166 and the patterning of the well 167 may be achieved by disconnecting the working electrode 105, allowing the strap 163 to float in potential, connecting the working electrode 105 to the metal strap 164, and setting the appropriate potential. In this case, the region 166 is removed, and the region 167 remains. Thus, this new technique permits the conversion of wells inside regions into regions, by removing the outer layer.

Figure 9A:
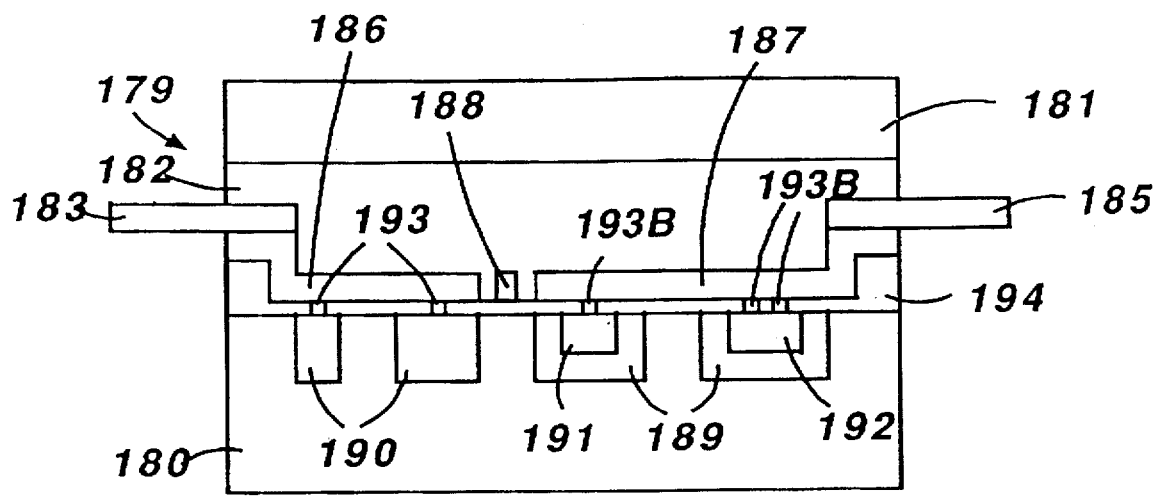
FIGS. 9A–D illustrate a manufacturing process permitting the sequential formation of multiple region types on a single sample.
Figure 9B:
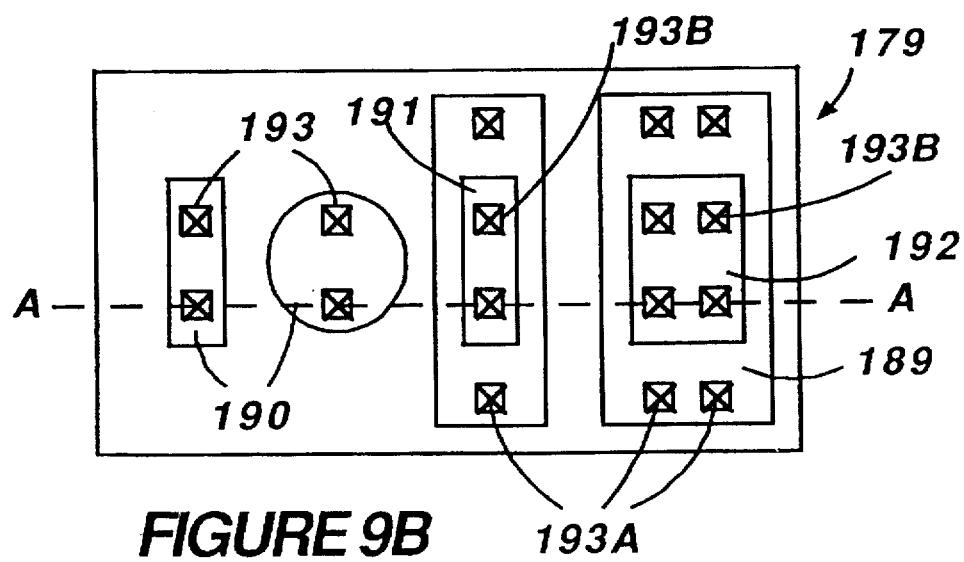
Figure 9C:
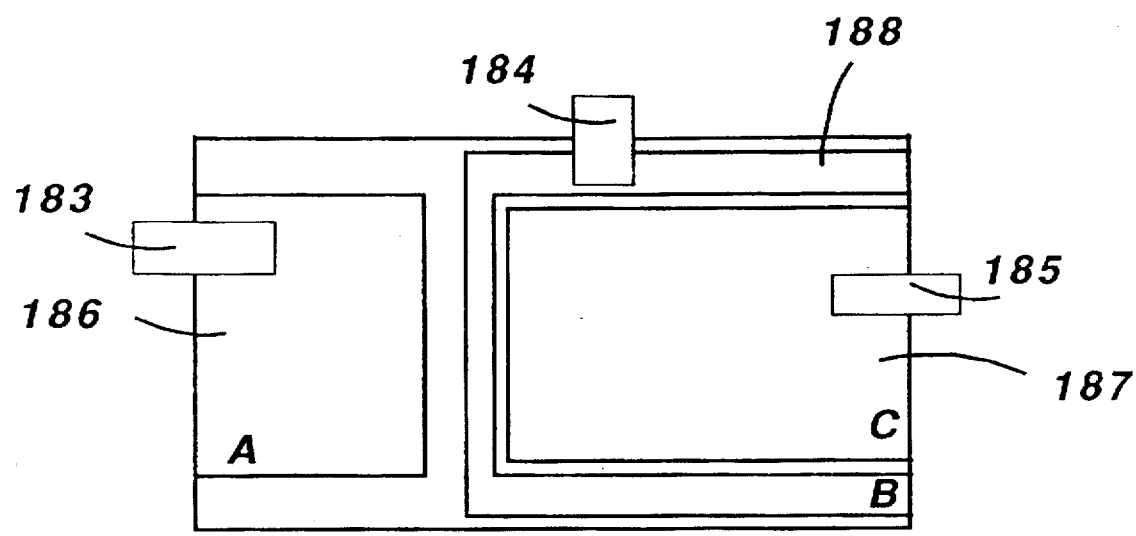

The invention permits the sequential formation of multiple region types on the same sample. FIG. 9A illustrates a cross-sectional view of a sample 179 taken along line A—A in FIG. 9B. The sample 179 includes a wafer 180 of conductivity type 1 that has been provided with a plurality of wells 189 and 190 of conductivity type 2, and a plurality of wells 191 and 192 of conductivity type 1. The wafer is bonded to a support structure 181 via an adhesive layer 182. An oxide layer 194 covers the wafer 180. Three metal layers 186, 187 and 188, shown in plan view in FIG. 9C, contact the wells 189, 190, 191 and 192 through a plurality of contact holes 193, 193A and 193B in the oxide layer 194, as shown in FIG. 9B. Three metal straps 183, 184 and 185, shown in FIG. 9C, make physical and electrical contact with the metal layers 186, 187 and 188. The contact holes 193, 193A and 193B may be filled with an etch resistant material such as copper, gold, tungsten, or another material which resists the exposure to the etchant and which protects the metal layers 186, 187 and 188, and the metal straps 183, 184 and 185, by preventing penetration of the etchant through the contact holes.

The silicon wafer 180 is removed using procedures outlined above. The regions 189 and 190 of conductivity type 2 are isolated. The two metal straps 183 and 184 are connected together to the working electrode 105 (FIG. 4), and the metal strap 185 is left floating, or can also be connected to the working electrode 105. After the completion of the first etch, the reduction of the region 189 and the patterning of the wells 191 and 192 may be achieved by retaining the working electrode 105 connected to strap 183; disconnecting the metal strap 184 and allowing it to float in potential; connecting the working electrode 105 to the metal strap 184; and setting the appropriate potential for the wells 191 and 192. In this case, the region 189 is reduced to regions 191 and 192. Therefore, it is possible to sequentially form multiple well types on the same sample using the present process.

Figure 9D:
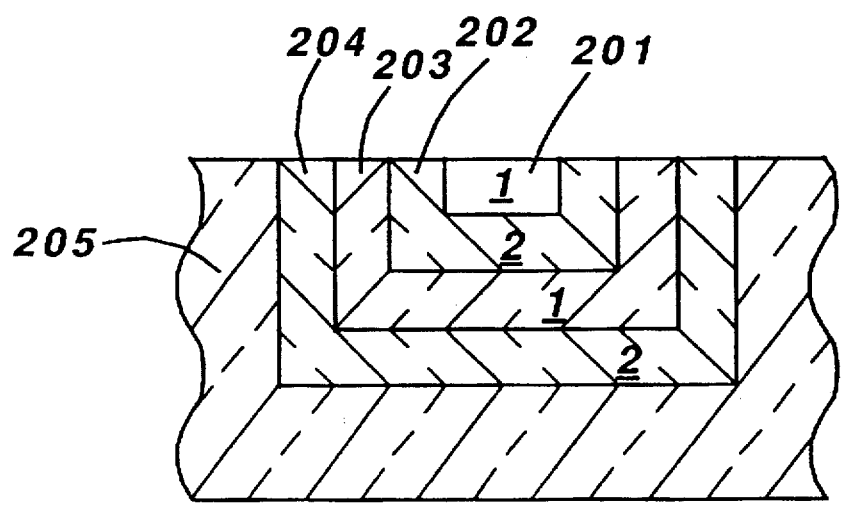

Another important feature of the present invention is that it can be extended to more than one level of wells of conductivity type 1 within wells of conductivity type 2. As shown in FIG. 9D, a well 201 of conductivity type 1 is contained within a well 202 of conductivity type 2 which is contained inside a well 203 of conductivity type 1 which is contained inside an outer well 204 of conductivity type 2, which, in turn, is contained in a substrate 205 of conductivity type 1. In this manner, multiple region-types each containing one or more wells can be formed.

Light-Induced Electrochemical Etching

The silicon region formation etch process may be enhanced by the addition of photochemical effects. Under certain circumstances light shifts the passivation potential towards more positive values in p-type silicon, whereas on n-type samples this shift goes in the negative direction. As a consequence, etching can be initiated by light on p-type silicon when a potential slightly above the passivation potential is chosen. Similarly, etching in progress can be stopped by light on n-type silicon when a potential slightly below etch stop is chosen. In this way greater flexibility in the bias range is available and it may be possible to perform the etching without bias or the need for a potentiostat by suitable choice of electrolyte.

Light sources 306 and 307 may be added to the apparatus of FIG. 4. The electrical potentials may be selected as before or alternatively the light sources 306 and/or 307 may illuminate the sample to enhance the potential effects and avoid the necessity of making electrical connections. When using bottom-side source 306 a suitable patterning of the metal layer 29 is necessary prior to electrochemical etching to provide illumination of the wells. Alternatively, or in addition, a transparent metal such as Indium Tin Oxide (ITO) may be used. In the case of top-side illumination 307, it is only necessary that the electrolyte be sufficiently transparent to the wavelengths of light being used. In this way, silicon of conductivity type 1 may be etched selectively to that of type 2, forming well 36.

Alternative Approaches

The silicon region formation of this invention is an inexpensive and simple process which eliminates at least one masking step, provides self control on the silicon thinning, and also avoids the re-introduction of the sample into a clean-room facility. Thus, the purchase of special lithography equipment to handle these samples is circumvented, providing additional savings. Furthermore, this is achieved without using HF as an electrolyte and employing only one working electrode. Avoiding these complications is a major bonus to the manufacture of products requiring transfer of crystalline silicon electronics onto alternative support members.

Transistor Performance Before And After Transfer

Figure 10A:
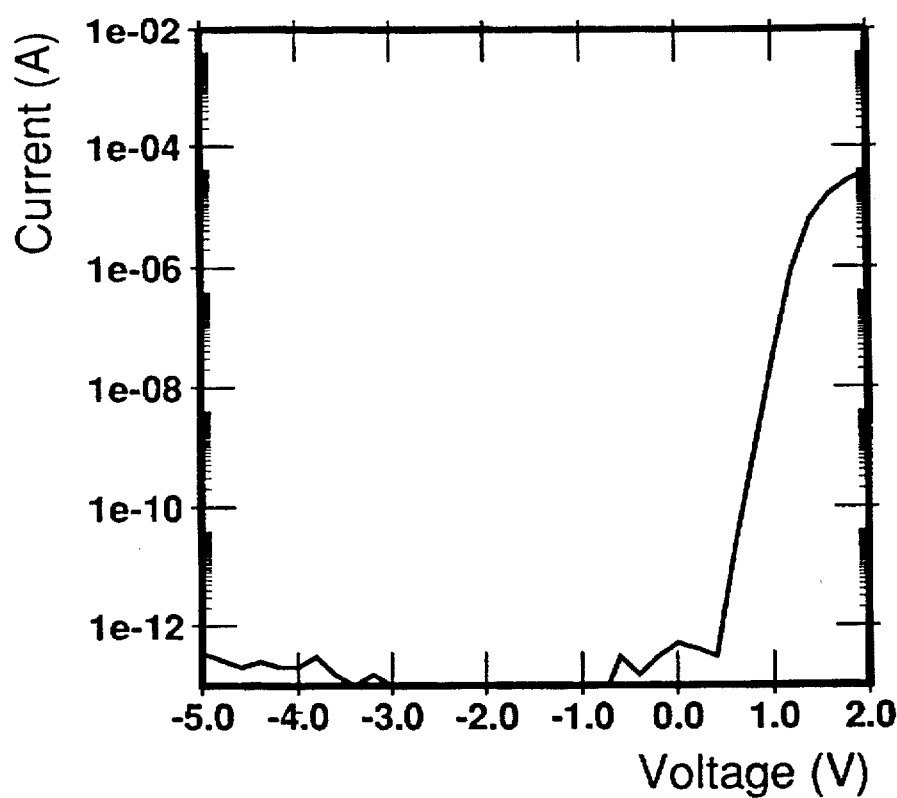
FIGS. 10A,B through 12A,B illustrate the electrical characteristics of MOS transistors before and after transfer.

FIGS. 10A,B–12A,B show the electrical characteristics of MOS transistors before and after transfer to an insulating support. The support member is Corning glass 7059. The MOSFET has a drawn width-to-length ratio of 24 μm/4 μm, a metal gate, and a gate oxide thickness of 420 Å. Since the transistor is not self-aligned, the actual channel length may be less than the drawn channel length.

Figure 10B:
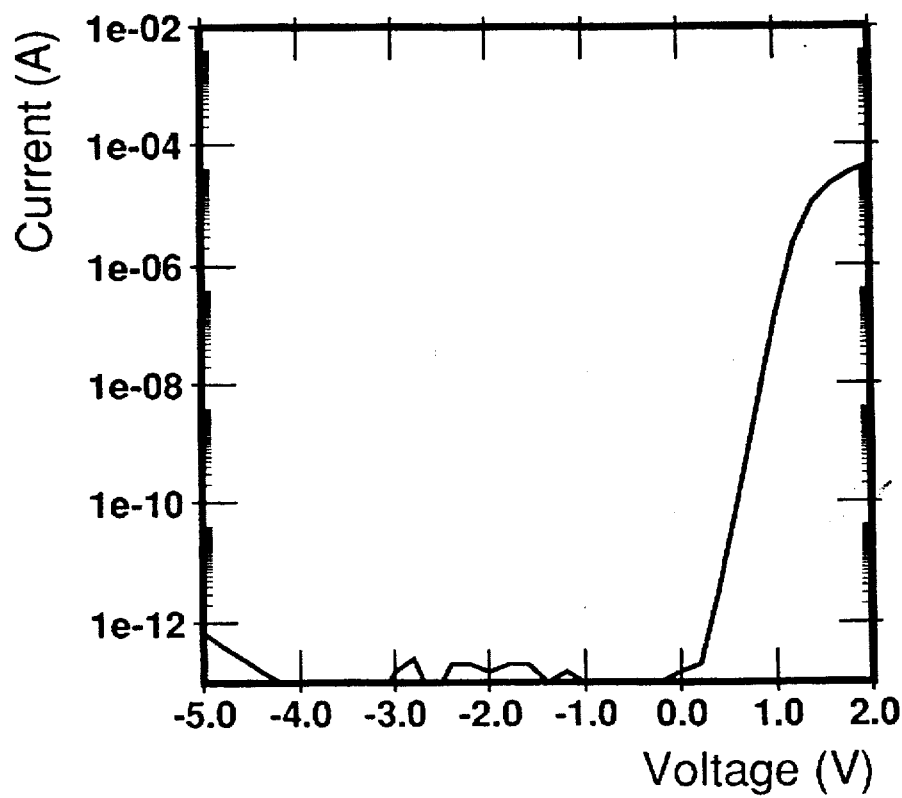

FIG. 10A shows the drain current, $I_D$, of a n-channel MOS transistor, before transfer, plotted on a logarithmic scale at a drain source voltage of 0.1 V, with gate voltage varying from −5 V to 2 V. FIG. 10B shows the same measurement on a transistor after transfer.

Figure 11A:
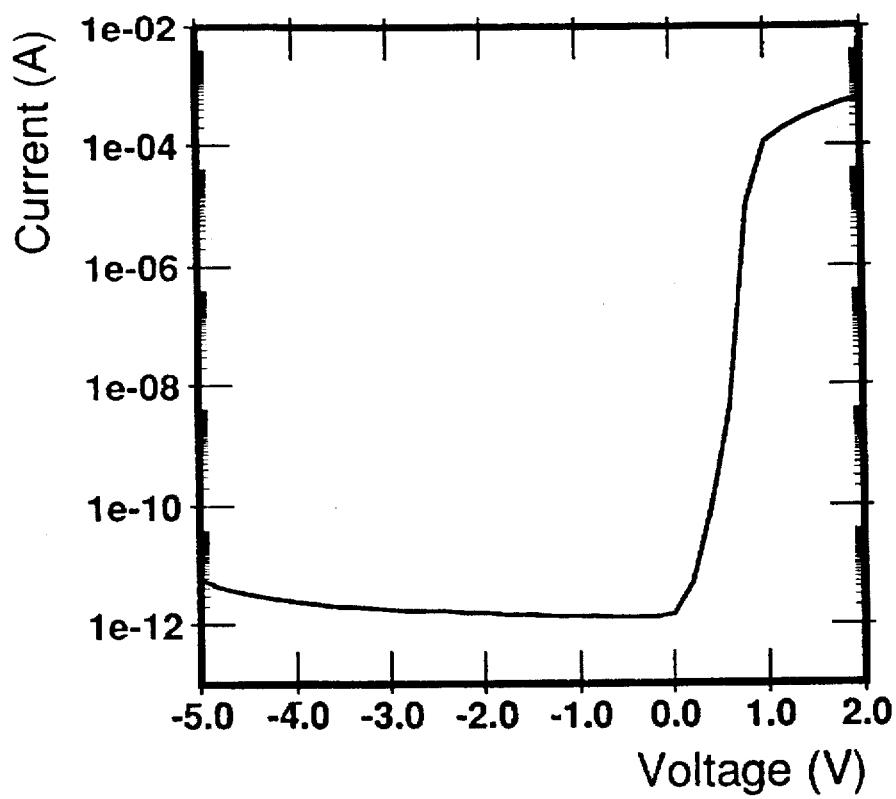
Figure 11B:
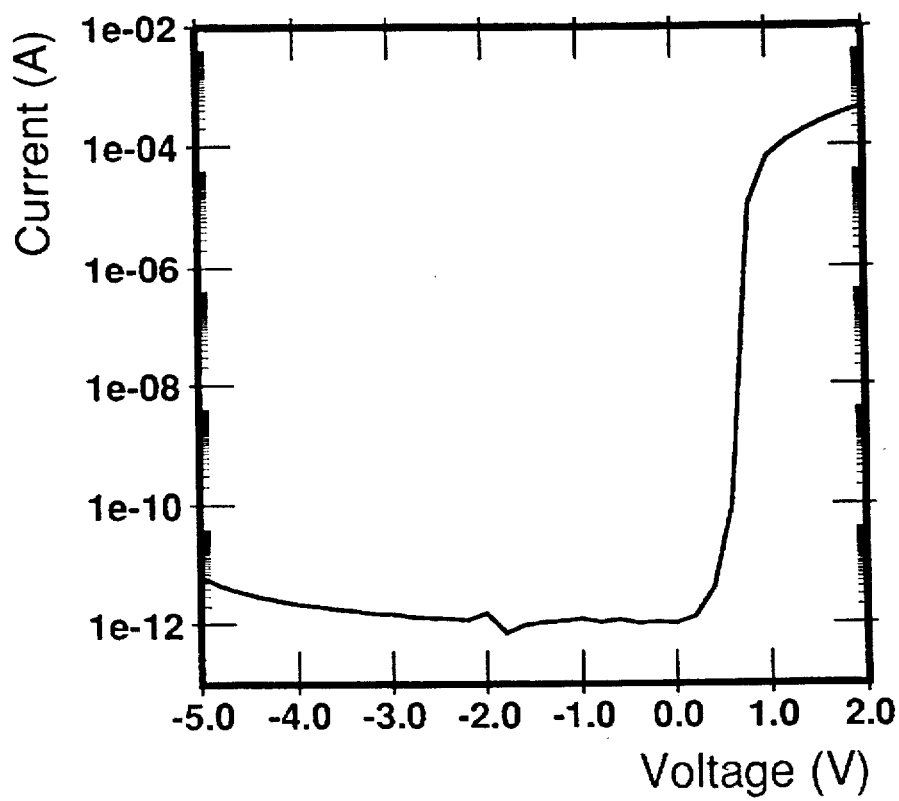

FIG. 11A shows the drain current, $I_D$, of a n-channel MOS transistor, before transfer, plotted on a logarithmic scale at a drain source voltage of 5 V, with gate voltage varying from −5 V to 2 V. FIG. 11B shows the same measurement on a transistor after transfer.

Figure 12A:
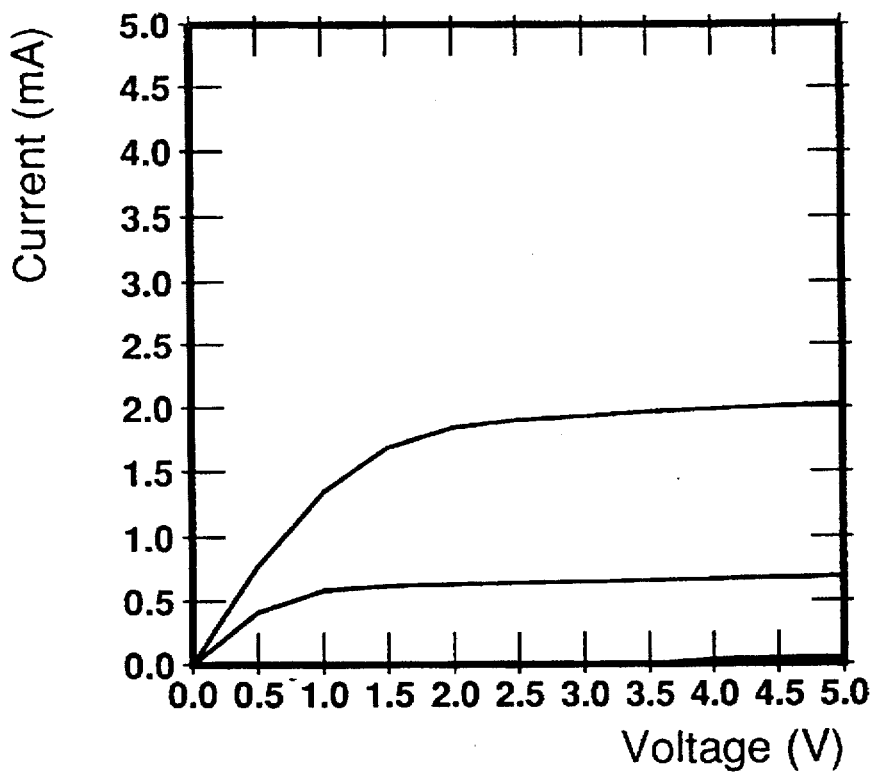
Figure 12B:
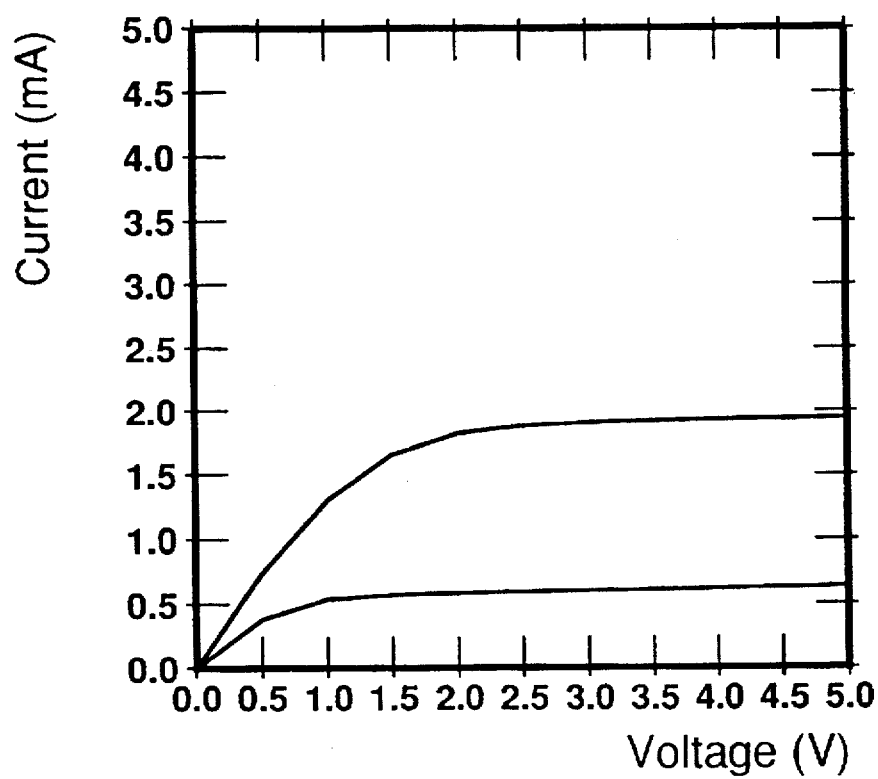

FIG. 12A shows the drain current, $I_D$, as a function of drain-source voltage at gate voltages of 1, 3, 5 V before transfer. Note that the 1 V curve appears along the horizontal axis. FIG. 12B shows the same measurement after transfer.

FIGS. 10A through 12B empirically illustrate an important aspect of the present invention, that transistor performance characteristics are substantially identical before and after the transfer. These results demonstrate that crystalline silicon circuits can be transferred onto almost any support by a simple inexpensive transfer process, and further that these crystalline silicon circuits can be transferred onto display quality supports, thus permitting the fabrication of high resolution video speed color displays with integrated drivers and pixel electronics. This provides a major opportunity for cost reduction in display manufacturing, and also leads to new opportunities in achieving higher speed, higher gate density silicon circuits on insulating support members, which provides both a simple alternative to expensive SOI substrates and a simple means to increase microprocessor speed by eliminating the silicon substrate. This is the first known demonstration of thin-film crystalline silicon electronics on an arbitrary support.

The foregoing examples show the performance of a transistor of drawn width-to-length ratio of 24 microns to 4 microns, but there is no known limit to the minimum feature size of transistor that may be transferred.

Flat-panel Display Considerations

Figure 6C:
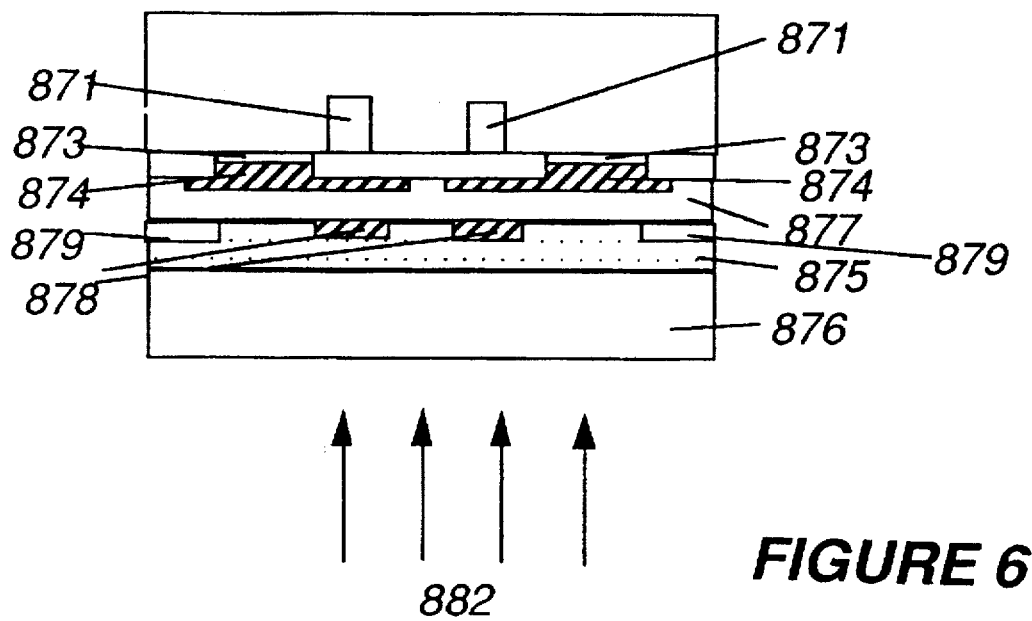
FIG. 6C is a schematic view of a crystalline silicon layer, after transfer and silicon region formation, on a supporting member including a dielectric layer, a light shield layer, and a light source.
Figure 6D:
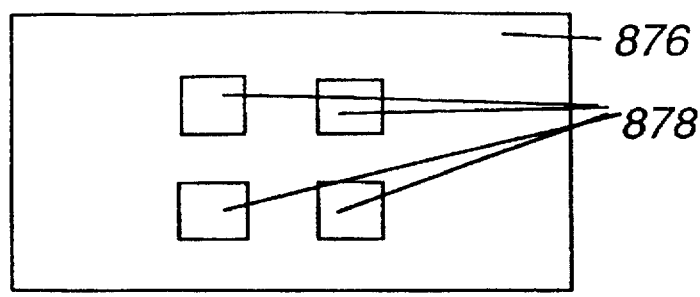
FIG. 6D is a plan view of a layout including a light shield layer.
Figure 6E:
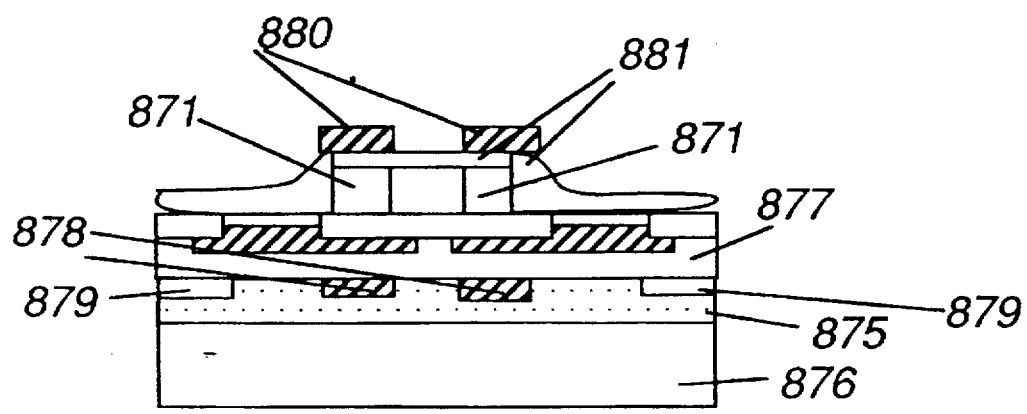
FIG. 6E is a schematic view of a layout including a second light shield layer which is deposited and patterned, and which is preceded by the deposition of a dielectric layer.

FIG. 6C shows a schematic of transferred segmented thin film crystalline regions 871 on a supporting member 876 similar to FIG. 6A with the added features of a dielectric layer 877 and a light shield layer 878. The purpose of the light shield layer is to prevent light penetration to the active regions 871 of the device. The light source 882 is normally located underneath the assembly. The light shield layer may be deposited and patterned or shadow masked as shown in FIG. 6C. After patterning it may be black-anodized to enhance pixel contrast or a black matrix material 879 may be deposited and patterned. A plan view of a layout of the light shield layer is shown in FIG. 6D. A second light shield layer may be deposited and patterned, preceded by the deposition of a dielectric layer 881 after removal of substrate 870, as shown in FIG. 6E, on the other side of the device regions 871 to further reduce light induced anomalies in performance.

Figure 13A:
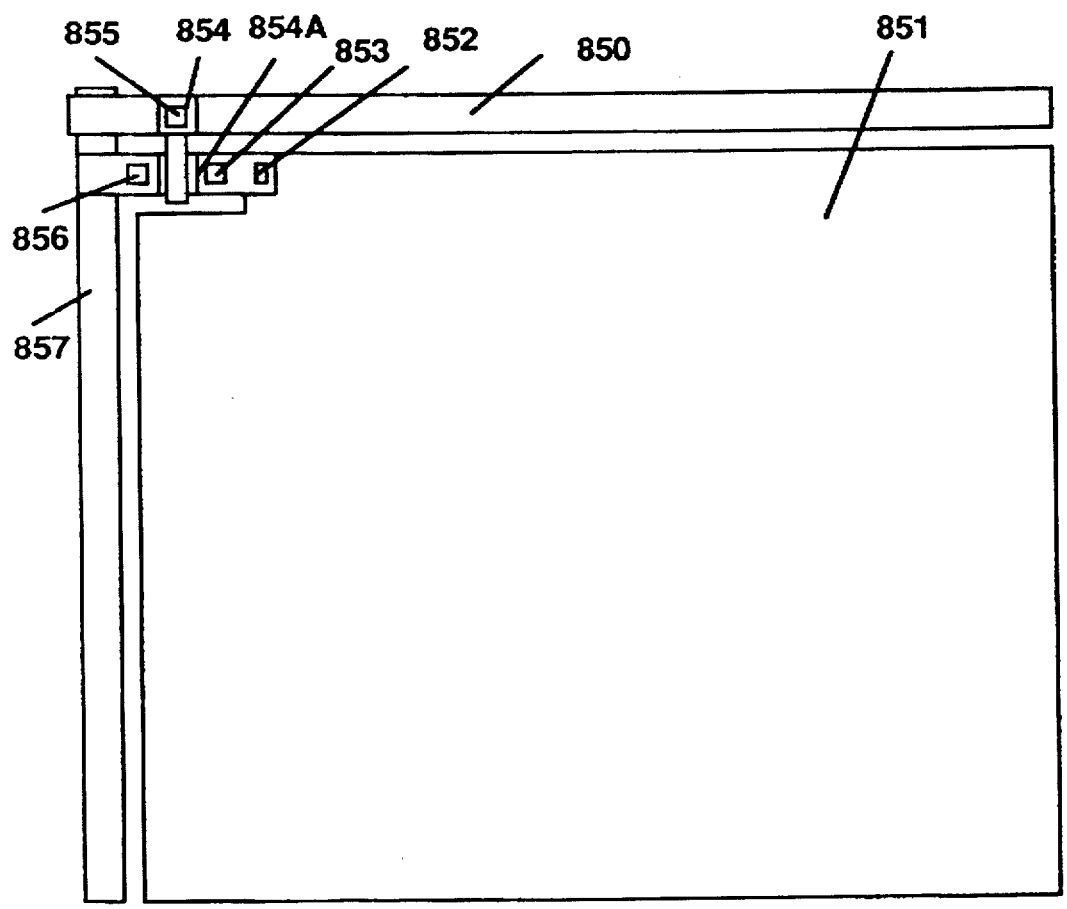
FIGS. 13A–E depict schematic layouts of pixel designs using crystalline silicon technology for use in the manufacture of a flat panel display.

An important feature of the present invention is that displays fabricated using crystalline silicon technology provide images with high brightness. The pixel aperture is defined as the percentage of transparent area to total maximum area. The minimum acceptable aperture is about 40%. FIGS. 13A–13E show layouts of pixel designs using crystalline silicon technology. A 2 mil (50 microns) pixel-design plan view, shown from the metalized side of the silicon substrate, is shown in FIG. 13A, in which 1 micron design rules have been assumed, the interconnects are 2 microns wide, and the transistor size is 2 microns wide and 1 micron long. The diagram shows a gate interconnect line 850, an ITO electrode 851, gate contact 855, gate polysilicon line 854, drain interconnect line 857, drain contact region 856, source metal region 854A, source contact region 853, and ITO contact region 852. The aperture for this design is estimated by calculating the area of ITO electrode 851 and subtracting the regions occupied by the interconnects and the pixel transistor. In this case, the aperture is approximately 80% for a 50 micron pixel design.

Figure 13B:
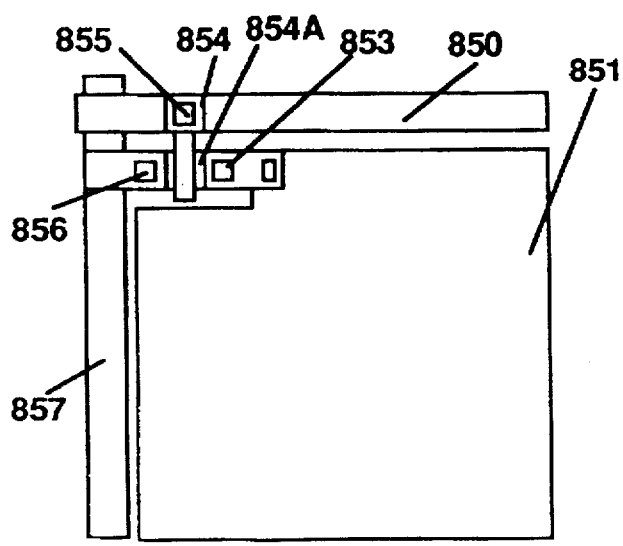
Figure 13C:
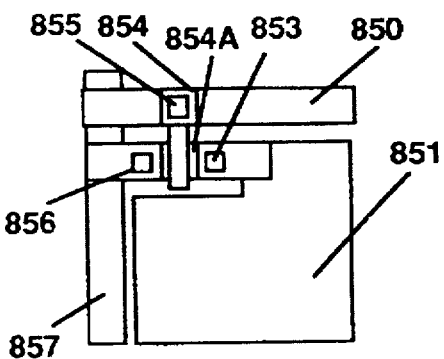

A smaller pixel design with the same design features is shown in FIG. 13B, in which the pixel size is 25 microns. The aperture is reduced to about 65%. Reducing the pixel size, as shown in FIG. 13C, even further to 15 microns, results in an aperture ratio of about 33%. Many of the features, such as transistor size, linewidths, and spaces may be reduced even further and geometrical effects can be introduced to maximize aperture ratio for smaller designs.

Figure 13D:
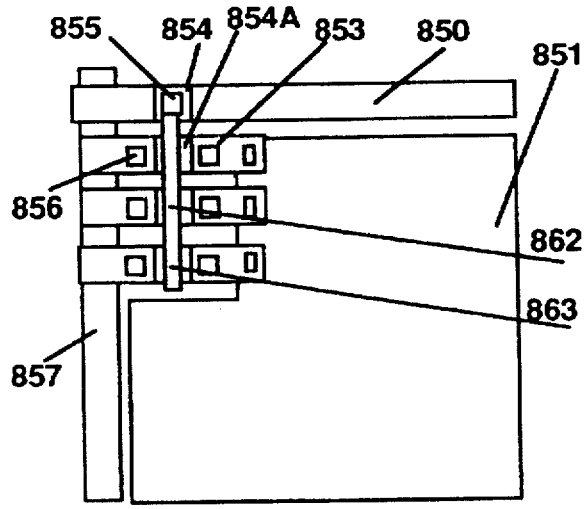
Figure 13E:
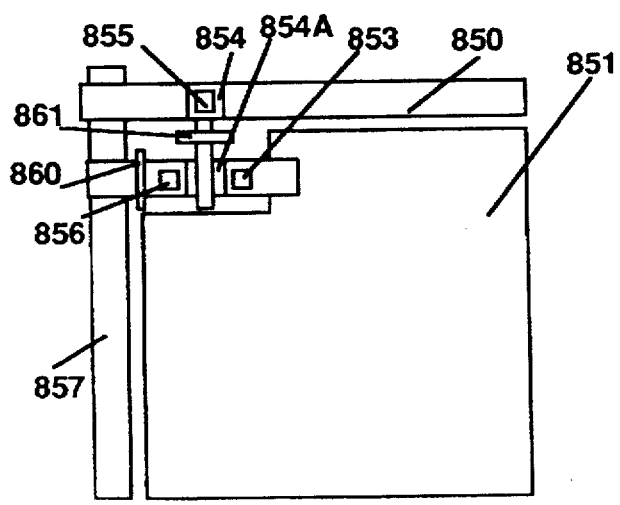

FIG. 13D shows a scheme for increasing pixel yield by taking advantage of the small size of transistor provided by state-of-the-art crystalline silicon fabrication technology. The pixel design is the same as FIG. 13B with two additional transistors 862 and 863. These transistors work in parallel to charge the ITO electrode 851. If one transistor fails, there are two backups to maintain the charge supply. Alternatively, if gate-to-drain shorts are a dominant failure mechanism, the faulty transistor may be cut out of the circuit using a laser while the remaining transistors perform the charging task. This redundancy scheme carries an aperture penalty which has to be weighed against higher display yield.

Since display circuits are usually high density circuits it is necessary to maximize yield of the circuits and pixels on the silicon substrate, and to take advantage of advanced repair techniques, for example, laser ablation and deposition. In particular, areas of laser access may be defined in the pixels to optimize this capability. In the case of driver circuits, redundant circuits can be included to provide backup for failures.

After detecting faults during test of the circuits on the silicon substrate, laser repair may be employed to eliminate faulty, or add functional, circuits. Alternatively, if further pixel faults are detected after transfer, laser access to each pixel may be provided near the gate and metal straps as shown by regions 860 and 861 in FIG. 13E.

Three-Dimensional Circuitry Embodiments

The performance characteristics of each circuit in a three-dimensional (3D) structure are related to the thermal conductivity of the medium in which the circuit is disposed. Semiconductor carrier mobility decreases as the circuit temperature increases and performance is directly related to carrier mobility. Thus, surrounding circuits in highly conductive epoxies provides lower device temperatures leading to improved performance characteristics. These epoxies can be filled with particles of thermally conductive materials such as diamond, aluminum nitride, silicon carbide, and other conductive compounds. There are many commercially available thermally conductive/electrically insulating epoxies.

An advantage of this approach is the capability to integrate heat sink layers within a stack of microelectronic circuit layers. Heat dissipation is an important problem in 3D architectures, and a capability for insertion of heat conducting layers between active electronic layers is advantageous. These layers can have much higher thermal conductivity than can be attained in silicon or other semiconductors used for heat transfer.

One significant aspect in the formation of three-dimensional circuits involves providing for the medium between the layered circuits. In such circuits, the epoxy disposed between the device layers may be spun and baked to dry out followed by the next layer of electronics.

Alternatively, other known techniques such as capillary action may be employed to obtain a thin, uniform layer of epoxy. A second aspect of the formation of three-dimensional circuits is forming interconnects. In this case, lithography may be used to mask, expose, and pattern holes in the medium between layers followed by metallization and patterning to provide interconnects.

In accordance with the present invention, a fabrication process comprising a single transfer step and backside processing steps can be employed to provide various 3D devices. The fabrication process includes the formation of circuits in a silicon wafer, adhering the circuits to a support member and removal of the silicon wafer. At this point, the silicon circuits have been single-transferred and the backside of the silicon circuit layer is exposed. Backside processing is performed provided processing is compatible with the selected adhesive.

Other preferred embodiments of the present invention relate to the formation of three-dimensional (3-D) circuits and devices. These three dimensional circuits and devices provide for high density circuitry in small areas. As such, three-dimensional circuits and devices may be used to fabricate high density electronic circuitry including but not limited to stacked memories, multi-functional parallel processing circuits, high density low-power CMOS static RAMs, peripheral drive circuitry for display panels, and a plurality of high-speed low-power CMOS devices.

Double Gate MOSFET

Figure 14A:
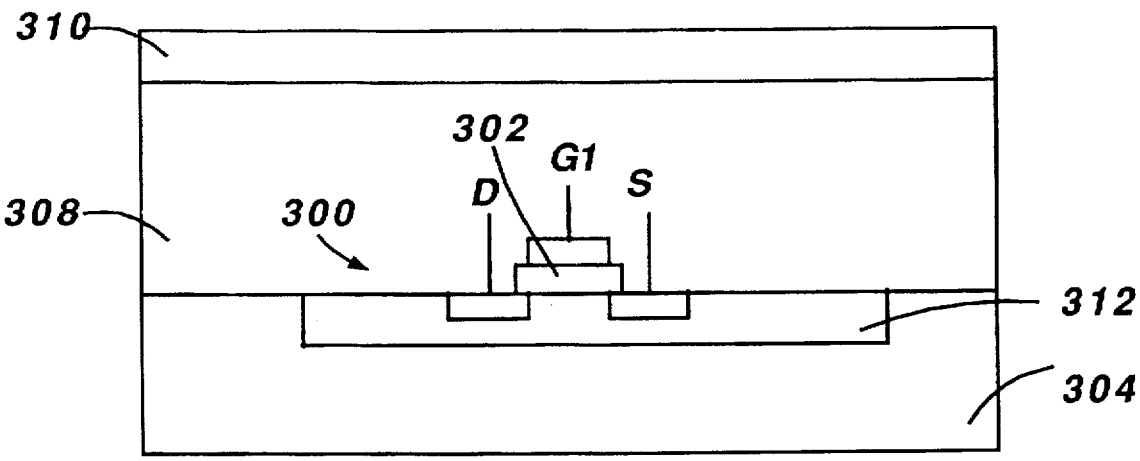
FIGS. 14A–C illustrate a preferred embodiment of fabricating a double gate MOSFET.
Figure 14B:
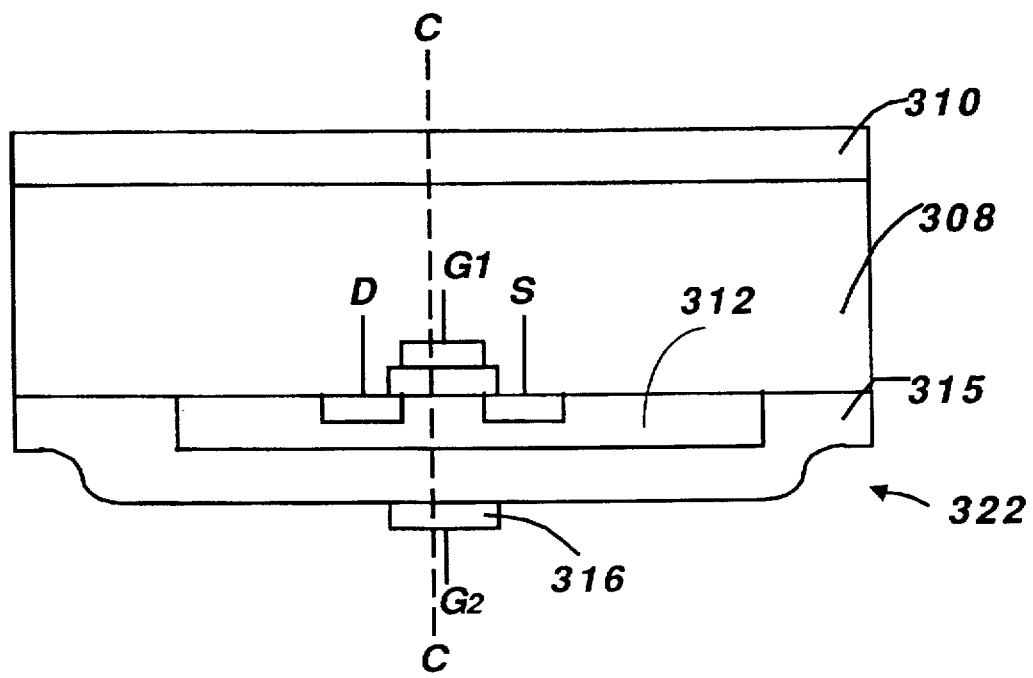
Figure 14C:
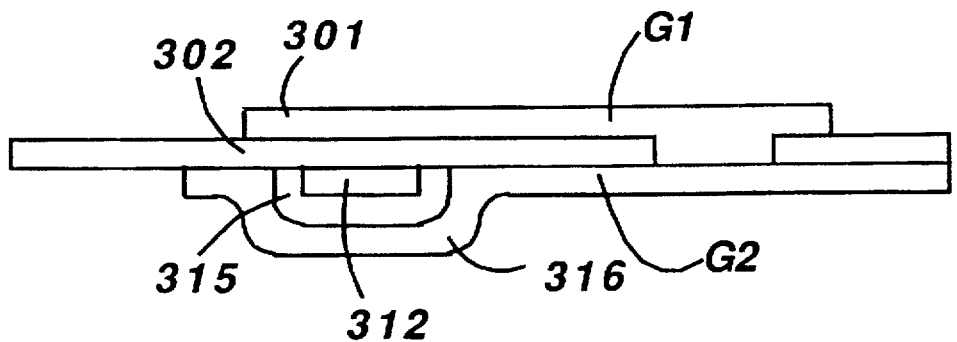

A double gate MOSFET can be formed by the above-fabrication process. FIG. 14A illustrates a standard MOSFET device 300 having a drain (D), a gate (G1) and a source (S) residing in a well region 312. A wafer 304 contains the MOSFET device 300. An epoxy layer 308 is used to attach an optically (or at least infrared) transmissive superstrate 310. A second gate dielectric (thin oxide) 315 is deposited as in FIG. 14B. A second gate 316 (G2) is formed over the thin oxide layer 315, and is electrically connected to the first gate (G1). As shown in FIG. 14C, which is a cross-sectional view of the structure shown in FIG. 14B taken along line C—C, a contact hole 319 is opened through dielectric 302 to electrically connect the second gate (G2) to the first gate (G1). This dual gate configuration serves to practically double the drive current for the resulting MOSFET device 322.

3D Vertical Inverter

Figure 15A:
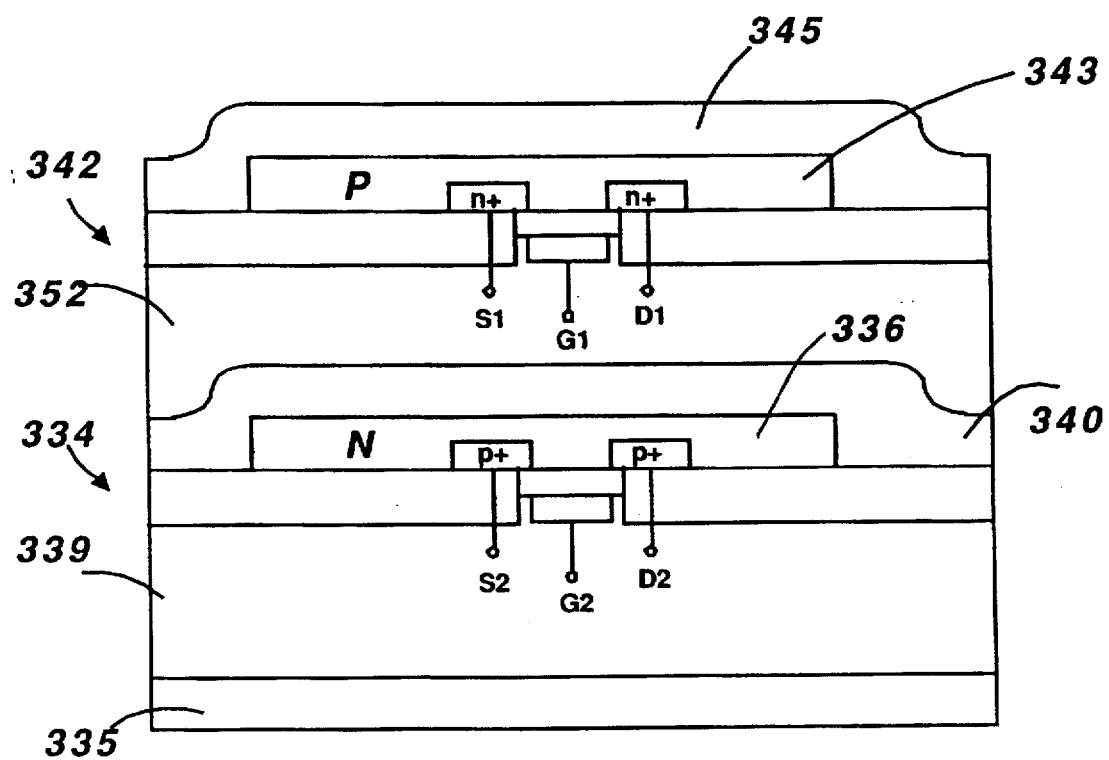
FIGS. 15A–B illustrate the fabrication process of a three-dimensional inverter.

The fabrication of a three-dimensional inverter 330 is shown in FIGS. 15A,B. A NMOS device 334 is attached with a suitable adhesive or epoxy 339 to a support member 335. A passivation oxide layer 340 is deposited over the device 334.

A PMOS device 342 is separately fabricated in crystalline silicon 343 and transferred onto, and attached to the n-channel device 334 by a suitable adhesive layer 352 forming a stacked structure. Next, an oxide layer 345 is deposited over device 342 for passivation.

Figure 15B:
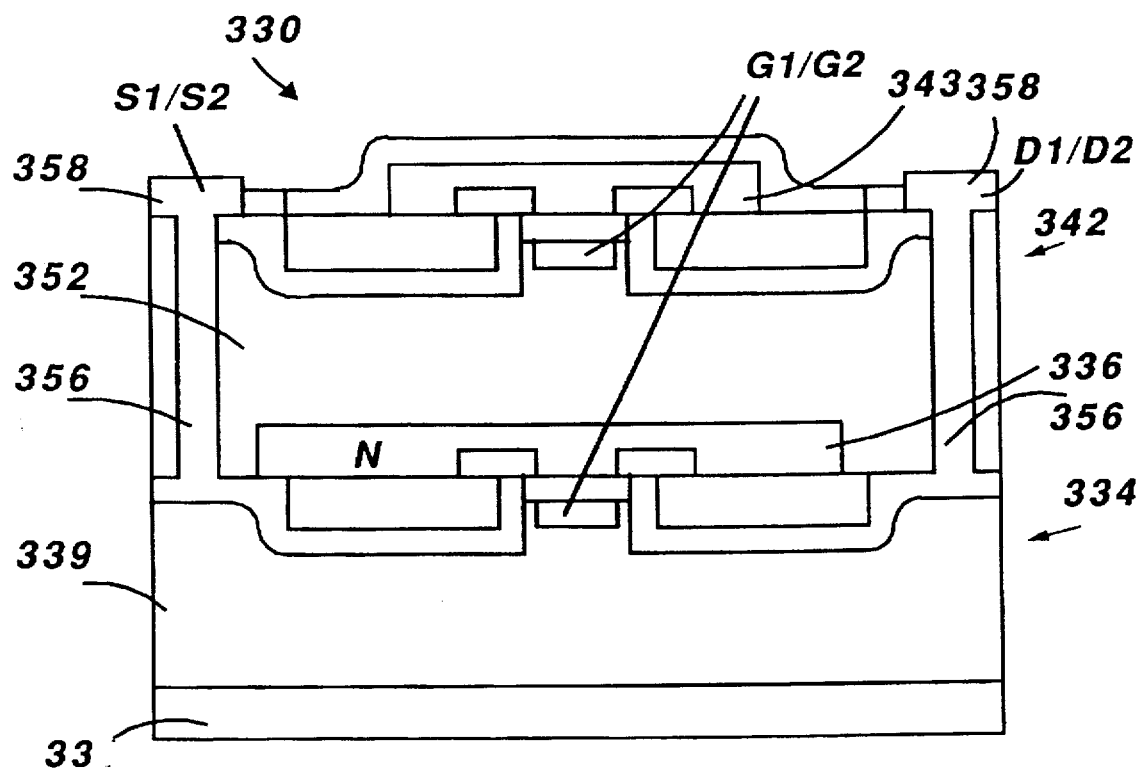

As shown in FIG. 15B, a plurality of vias 356 are formed to access the gate, source and drain regions of the upper device 342, and the buried device 334. A metal layer 358 is deposited and patterned to form electrical interconnects, for the stacked inverter 330. It is noted that the interconnection of the respective gates is made in a plane orthogonal to the page such that the gate vias are not shown.

Vertical Bipolar Transistor

Figure 16A:
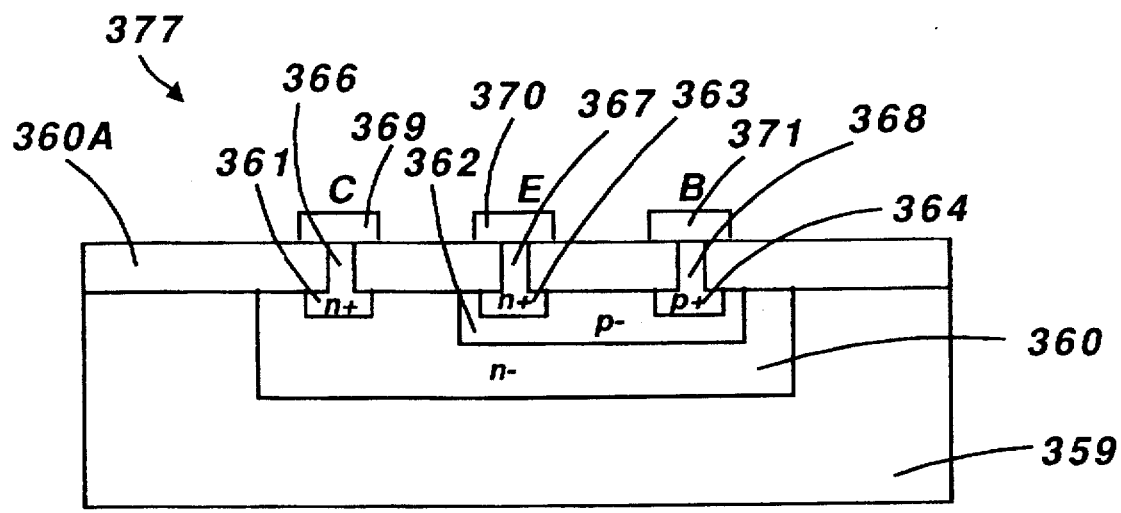
FIGS. 16A,B illustrate the fabrication process of a vertical bipolar transistor.

One implementation of a vertical bipolar transistor 377 is shown in FIG. 16A. A deep n-well collector 360 is implanted and diffused in a silicon wafer 359, and a p-type base 362 and an n-type emitter 363 are sequentially implanted and diffused in the n-well collector 360. Contact regions 361 and 364 are implanted and activated. Contact hole regions 366, 367 and 368 are patterned and etched in an oxide layer 360A. Metal is deposited and patterned to form metal contacts 369, 370 and 371 for the collector 360, base 362 and emitter 363 respectively.

Figure 16B:
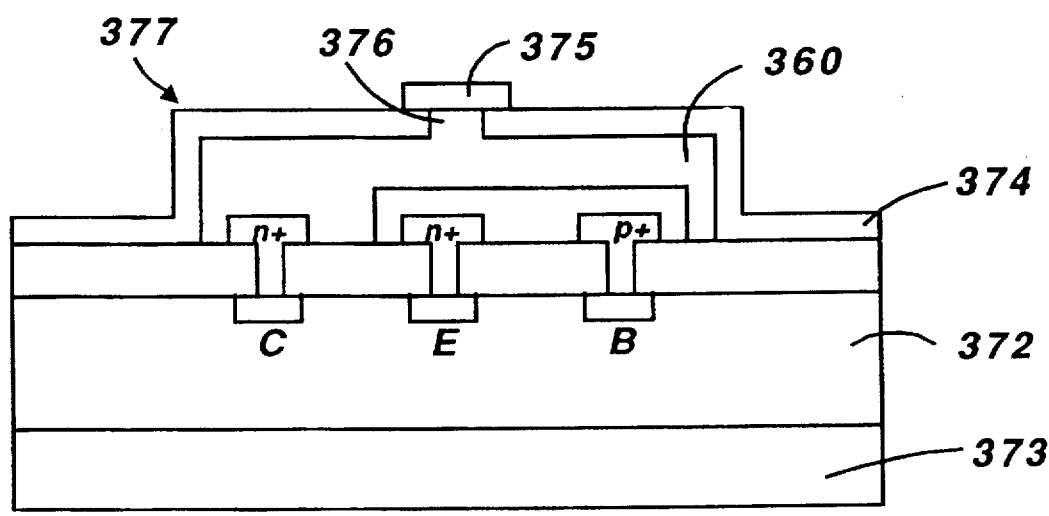

The device 377 is transferred to a support member 373 (FIG. 16B) using an epoxy layer 372. A dielectric material 374 is deposited over the region 360, and a contact hole 376 is patterned and etched in the dielectric material 374. A metal layer 375 is deposited and patterned on the backside of the silicon film over the oxide layer, and annealed.

3D III-V Circuit Array

Three dimensional circuits of silicon in combination with III–V semiconductor materials can also be fabricated with appropriate release layer materials and etchant. For an AlGaAs/GaAs device, an AlAs release layer is preferred. For an InP device, an InGaAs release layer is used. AlAs is preferentially etched by HF acid, while InGaAs is preferentially etched by sulfuric acid/hydrogen peroxide and water solution. The process can also be extended to II–VI semiconductor circuits.

Figure 17A:
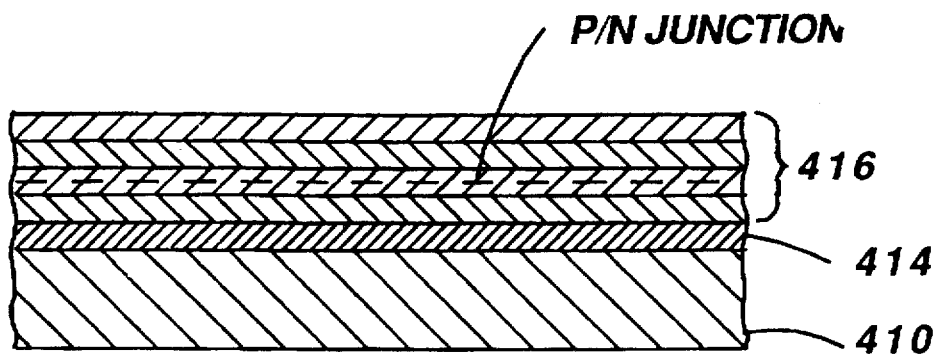
FIGS. 17A–D illustrate the fabrication process of a III–V circuit array.

This methodology may be used in conjunction with silicon region formation to form multiple layers of interleaved electronics comprising any combination of silicon and III–V circuits. It begins with the epitaxial growth of the required heteroepitaxial layers of AlGaAs and GaAs layers on a GaAs or Ge substrate. If a GaAs substrate 410 is used as shown in FIG. 17A, layer 414 of AlAs is formed between the active AlGaAs layers 416 and the substrate 410 to facilitate substrate removal by the etch-off method. The AlAs forms an etch stop layer.

Figure 17B:
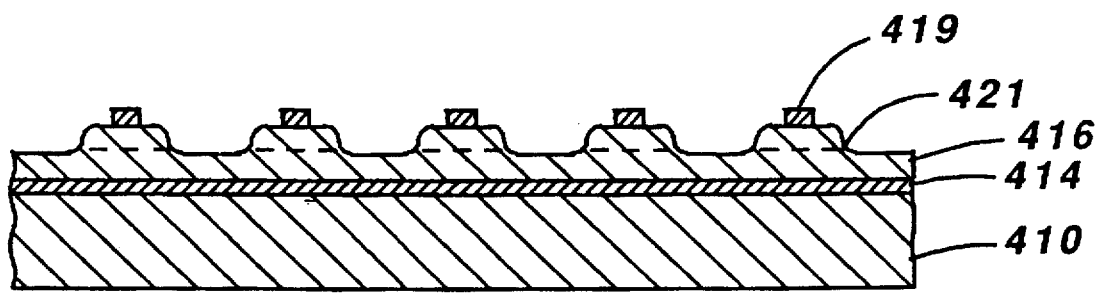

FIG. 17B shows a pattern of contact pads 419 and busbars (not shown) formed by photolithographic techniques, evaporation, and/or electroplating on the front surface. Next, the circuits 421 (MESFETs) are isolated by etching part way into the epitaxial layers 416.

Figure 17C:
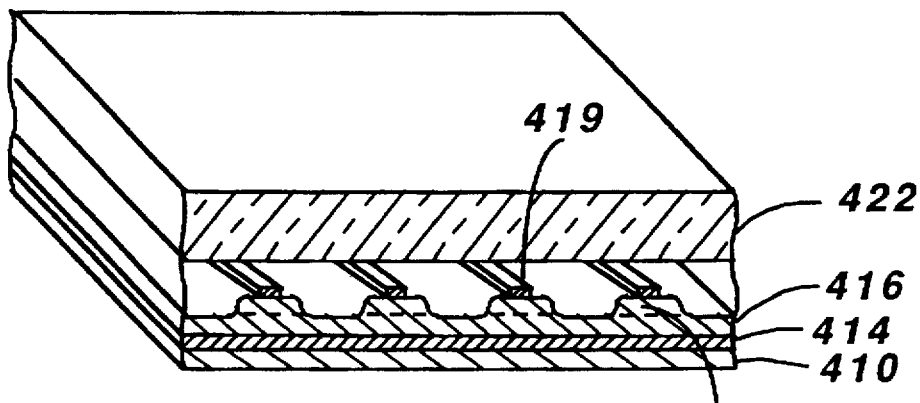
Figure 17D:
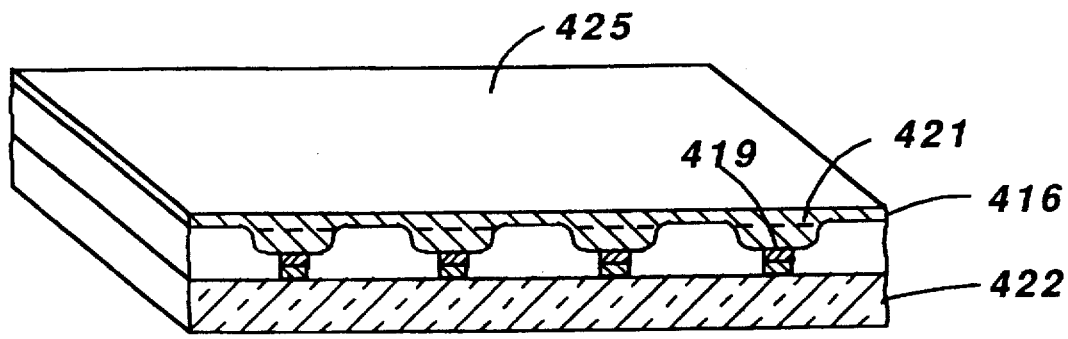

The next stage of the process is illustrated in FIG. 17C and includes bonding the wafer to a support 422, such as glass, ceramic, stainless steel, or any other suitable material. The processed front side is bonded to the support 422 using a suitable adhesive. After the support 422 is attached, the wafer or support member 410 is etched off (or cleaved off) leaving the thin film 416 attached to the support 422, as shown in FIG. 17D, in which the structure has been flipped over onto the support to expose the backside 425 for processing. Once the backside is exposed, any remaining non-essential material is removed from the back by selective etching in HF to expose a clean GaAs contact layer 425.

Liquid Crystal Displays

Figure 18:
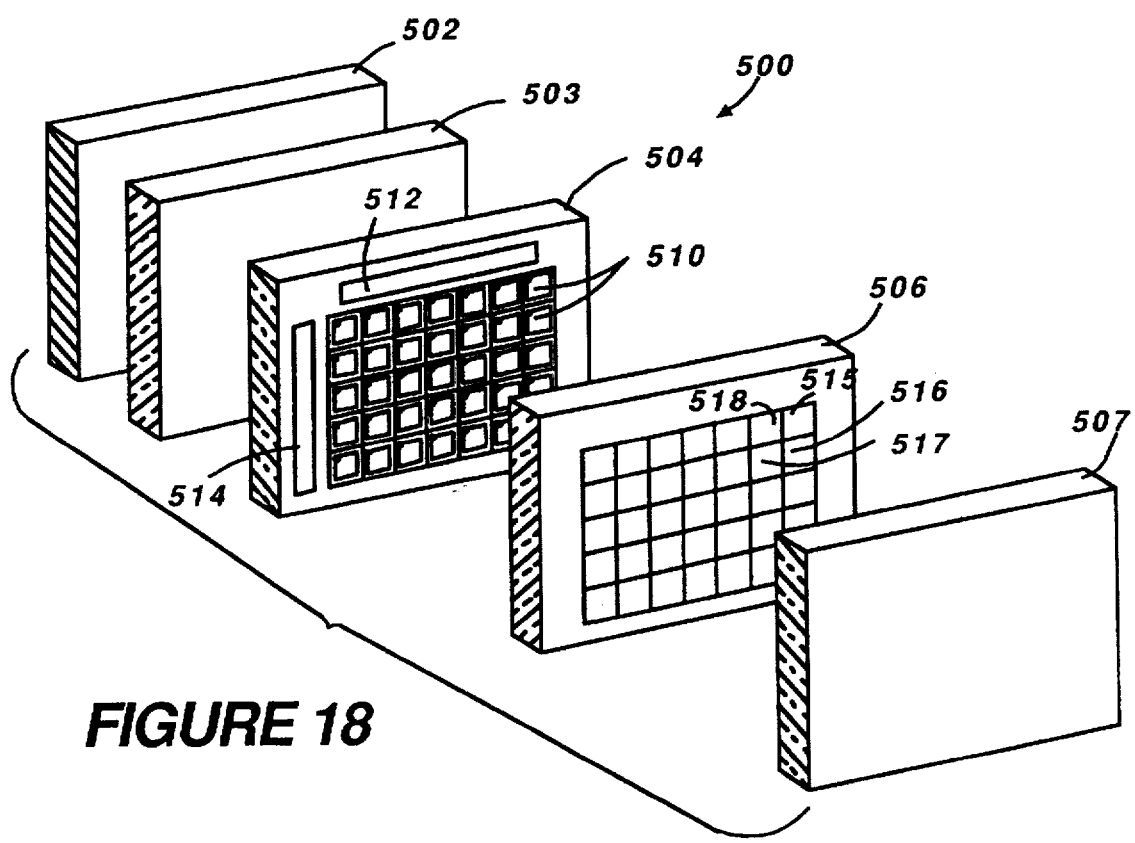
FIG. 18 is an exploded perspective view of a flat panel display using the regions, circuits or devices formed by the fabrication processes.

A flat-panel panel display 500 is shown in FIG. 18. The basic components of the display 500 include a light source 502 that can be white or other appropriate color, a first polarizing filter 503, a circuit panel 504, a filter plate 506 and a second polarizing filter 507, which are secured in a layered structure. A liquid crystal material (not shown) is placed in a volume between the circuit panel 504 and the filter plate 506. An array of pixels 510 on the circuit panel 504 are individually actuated by a driver circuit having first and second circuits 512, 514, respectively, adjacent to the array of pixels 510, such that each pixel can produce an electric field in the liquid crystal material lying between the pixel and a counter electrode secured to the color filter plate 506.

The electric field causes a rotation of the polarization of light being transmitted across the liquid crystal material that results in an adjacent color-filter element being illuminated.

The color filters of the system 506 are arranged into groups of four filter elements such as blue 515, green 516, red 517, and white 518. The pixels associated with filter elements 515, 516, 517, 518 can be selectively actuated to provide any desired color for that pixel group.

Other preferred embodiments employ the use of a solid state material in place of the liquid crystal material to form a light valve for each pixel. A light emitting material such as an electroluminescent film or any material whose optical transmission properties can be altered by the application of an electric field can be used to supply the light valves of the present invention.

Figure 19:
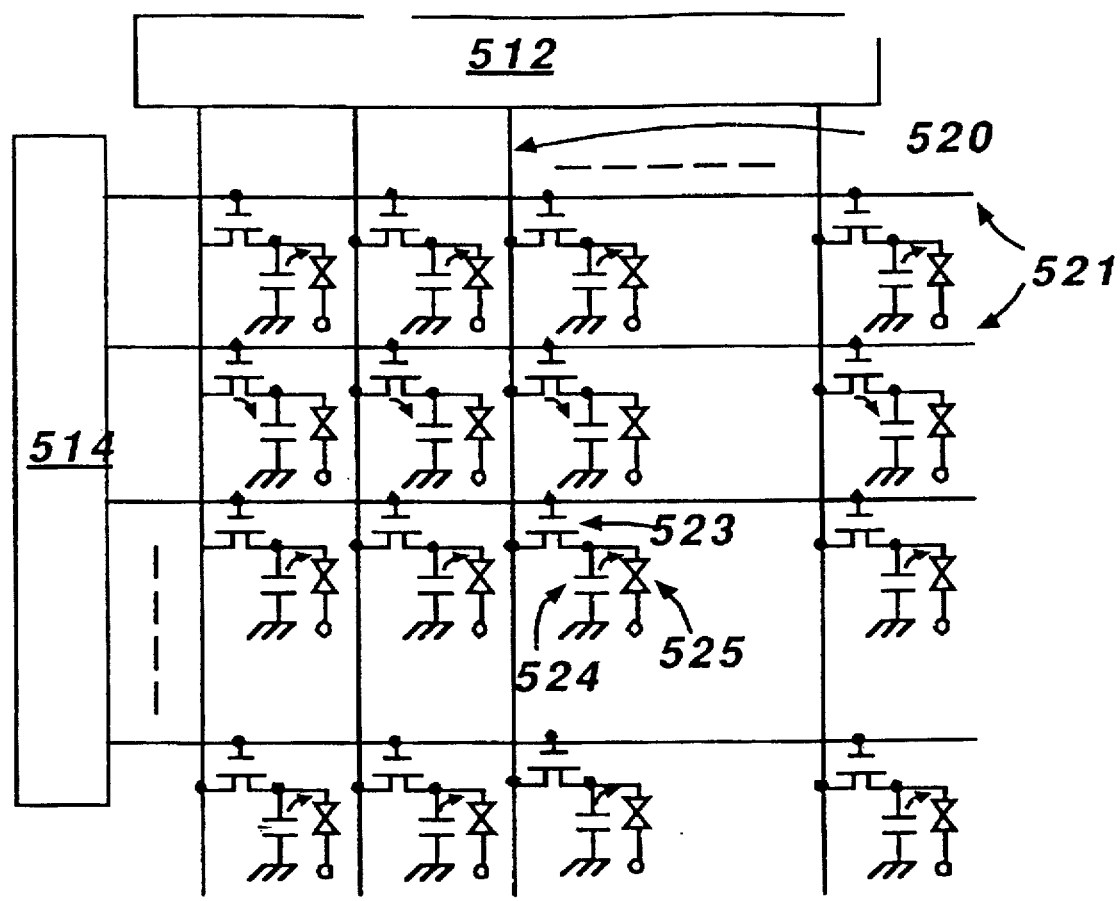
FIG. 19 is a circuit diagram of a liquid crystal display showing a pixel and driver scheme forming part of the flat panel display of FIG. 18.

An exemplary pixel scheme used to control the display on the panel 500 is illustrated in FIG. 19. The first circuit 512 receives an incoming signal and sends a signal to the pixels through buses 520. The second circuit 514 scans through buses 521 to turn on the individual transistors 523 which charge a capacitor 524 in each pixel. The capacitor 524 sustains the charge on the pixel electrode and the liquid crystal 525 until the next scan of the array.

Figure 20:
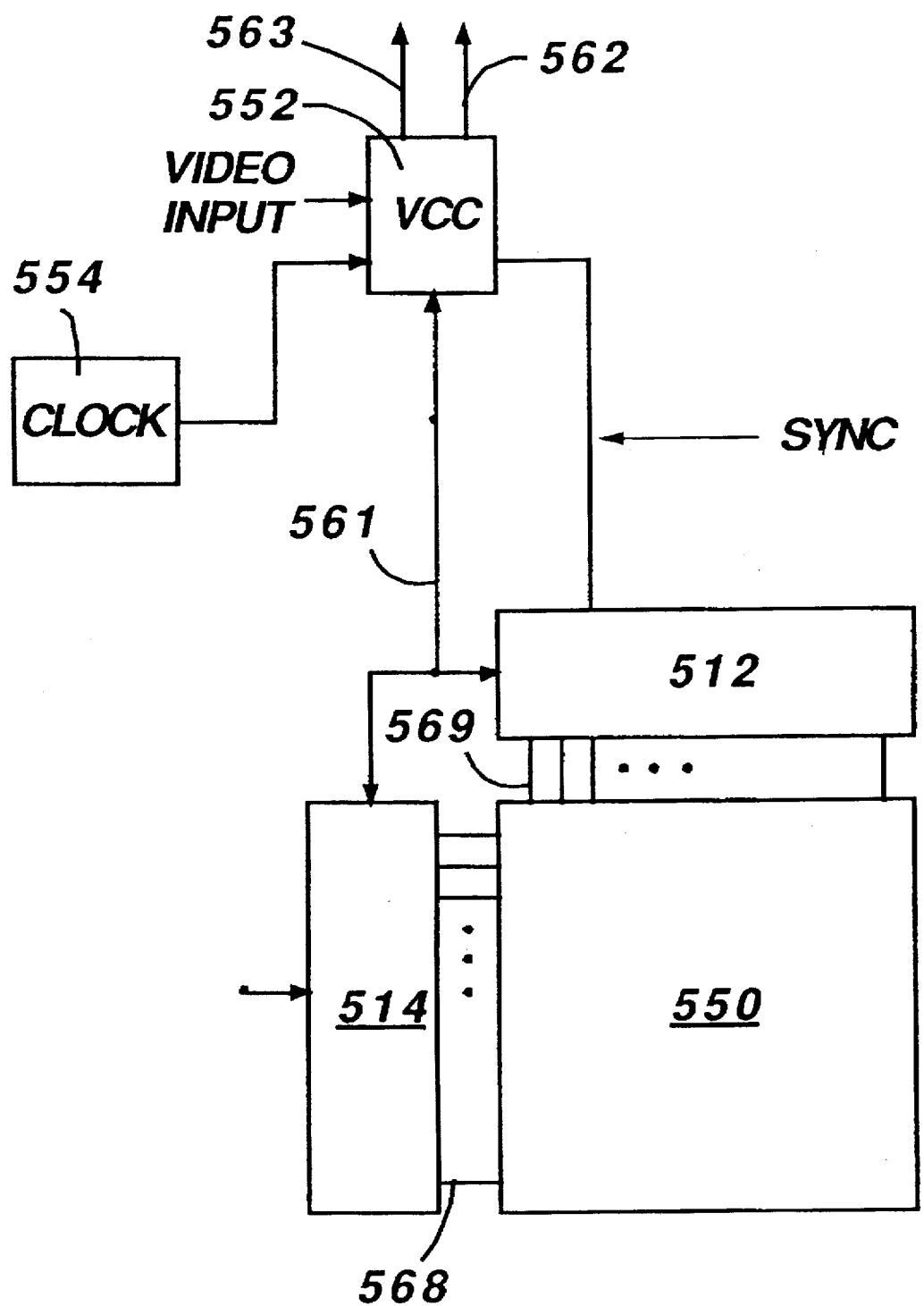
FIG. 20 is a block diagram of a circuit for driving one or more light valve matrices of the flat panel display of FIG. 18.

A circuit block diagram for driving one or more light valve matrices is illustrated in FIG. 20. An active matrix 550 comprises a plurality of light valves which are individually actuated by the driver circuit of FIG. 19. The driver circuitry is controlled by a video conditioning circuit (VCC) 552, a system clock 554, column drivers 512, and row drivers 514.

The video conditioning circuit 552 receives a video input signal which may be an RGB signal, an NTSC signal or other video format signal, or any digital or analog signal. The conditioning circuit processes the incoming signal producing separate video output signals on lines 561, 562 and 563, for each primary color and a synchronization signal for the column and row driven 512 and 514, respectively. The video output signal on line 561 is a serial data stream wherein the amplitude of each signal of the data stream determines the intensity of light transmitted through each light valve.

The serial data stream received by the row drivers 514 is sent to the light valves through buses 568. The column drivers receive the sync signal and send data through buses 569 to turn on individual transistors allowing the associated signal of the data stream to charge the capacitor 524 (FIG. 19) in each pixel.

Stretching Technique

Figure 21:
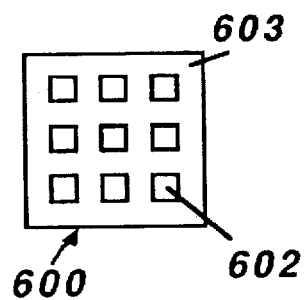
FIGS. 21, 22 and 23 illustrate a process for stretching or contracting a stretchable tape or film until the devices fabricated according to the present invention are positioned correctly.
Figure 22:
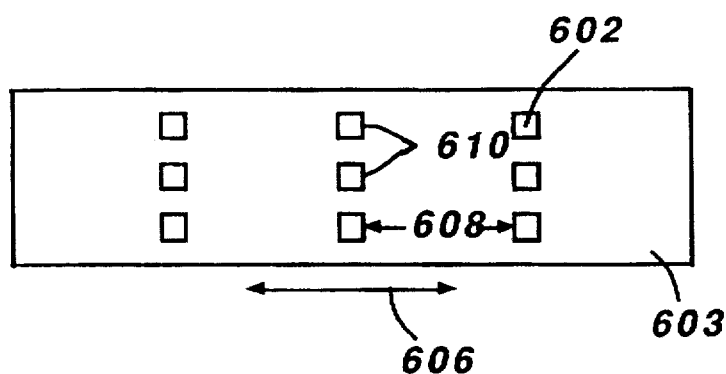
Figure 23:
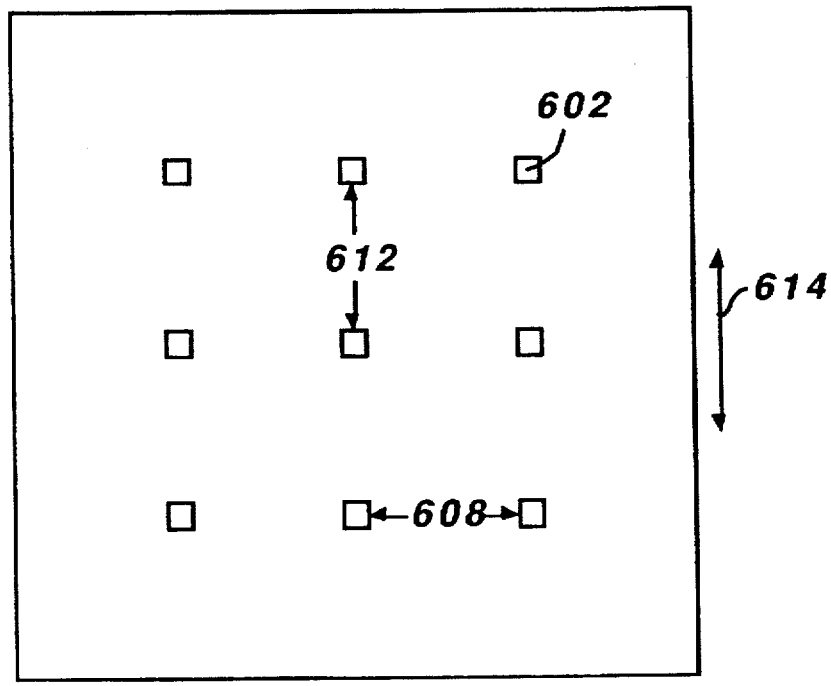

A method to transfer tightly placed devices to positions that are not so tightly spaced on a circuit panel is illustrated in FIGS. 21, 22 and 23, and uses stretching or contracting of a stretchable tape or film until the devices are positioned correctly. Commercially available devices can be used to precisely control the stretching of the film. Various methods can be used to measure the spacing of devices during stretching and transfer to provide proper registration of components.

As illustrated in FIG. 21 a structure 600 includes an array of transistors or thin-film semiconductor regions 602 transferred onto a stretchable support 603. Transistors or regions 602 have been fabricated and transferred in accordance with the procedures set forth above. The support 603 can comprise an adhesive.

In a first embodiment the structure is stretched along an axis 606, as shown in FIG. 22, thereby increasing the distance 608 between the devices 602 along the axis 606 while leaving the distance 610 between the devices in another direction unchanged. The support 603 is stretched along an axis 614 to produce the array shown in FIG. 23, where the devices 602 have spacing 608 in one direction and spacing 612 in an orthogonal direction.

Figure 24:
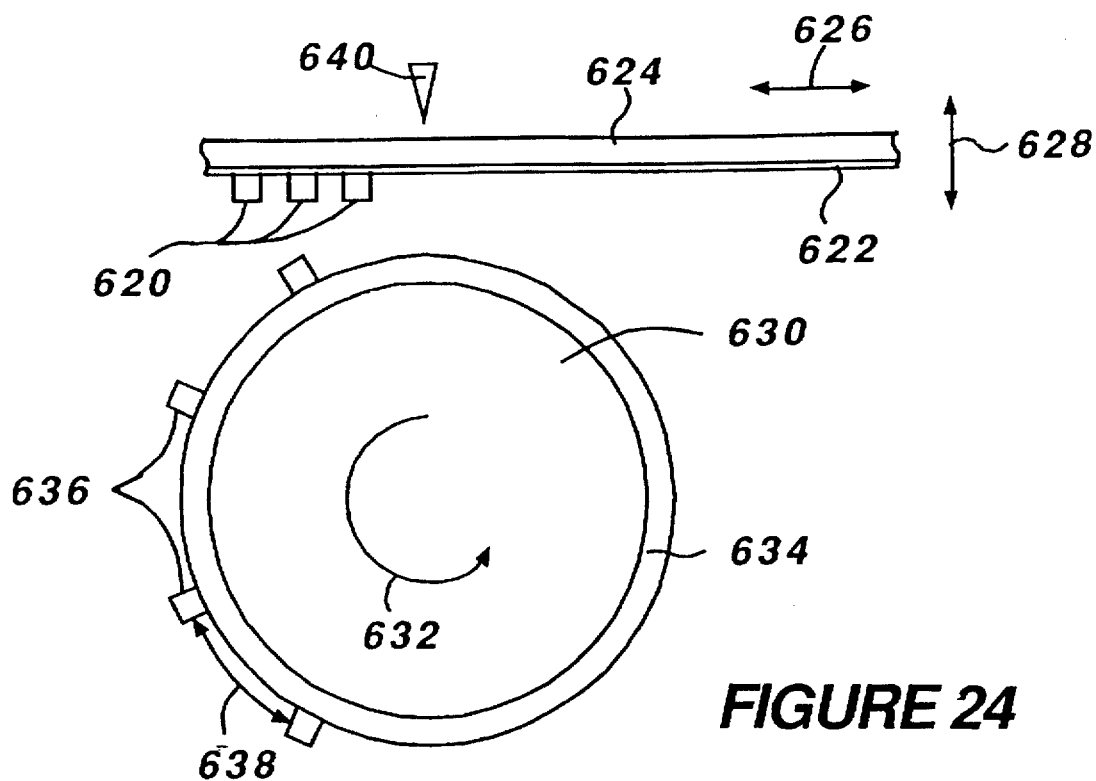
FIG. 24 illustrates an exemplary mechanical technique for accomplishing the process of FIGS. 21 through 23.

A mechanical technique shown in FIG. 24 starts with a lifted off array of devices 620 on a tape 622. This tape 622 is placed on a frame 624 that moves along axes 626 and 628. A drum 630 has a flexible tape 634 placed around its circumference. An instrument 640 is pushed onto the device 624, pushing the first row of devices onto the drum tape 634. The drum tape 634 is rotated in direction 632 and the instrument 640 pushes a second row of devices with spacing 638 onto the tape 634. This continues until all the rows are transferred. In this way, any arbitrary arrangement of row and column spacings may be selected and the spacing between individual devices may be made arbitrarily large.

Another embodiment is to stretch the tape in one direction, transfer this to another tape and stretch that tape in the other direction and transfer the devices to the final support. This method is well-suited for small disconnected devices.

Projection Devices

Figure 25:
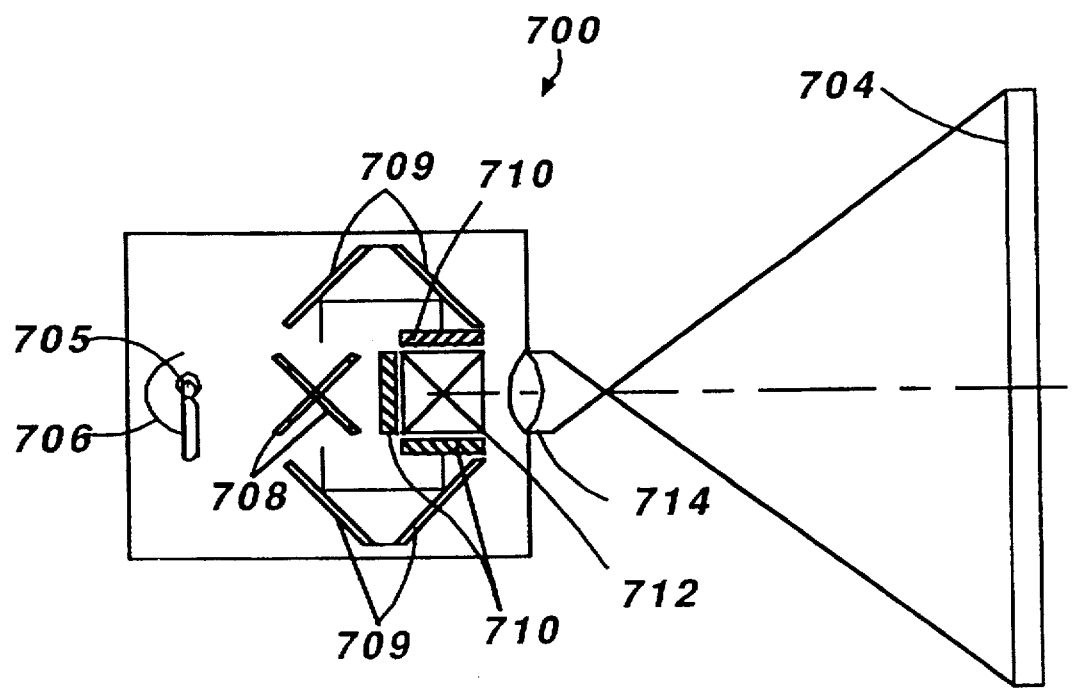
FIGS. 25, 26 and 27 illustrate various projection devices using the regions, circuits or devices formed by the fabrication processes according to the present invention.
Figure 26:
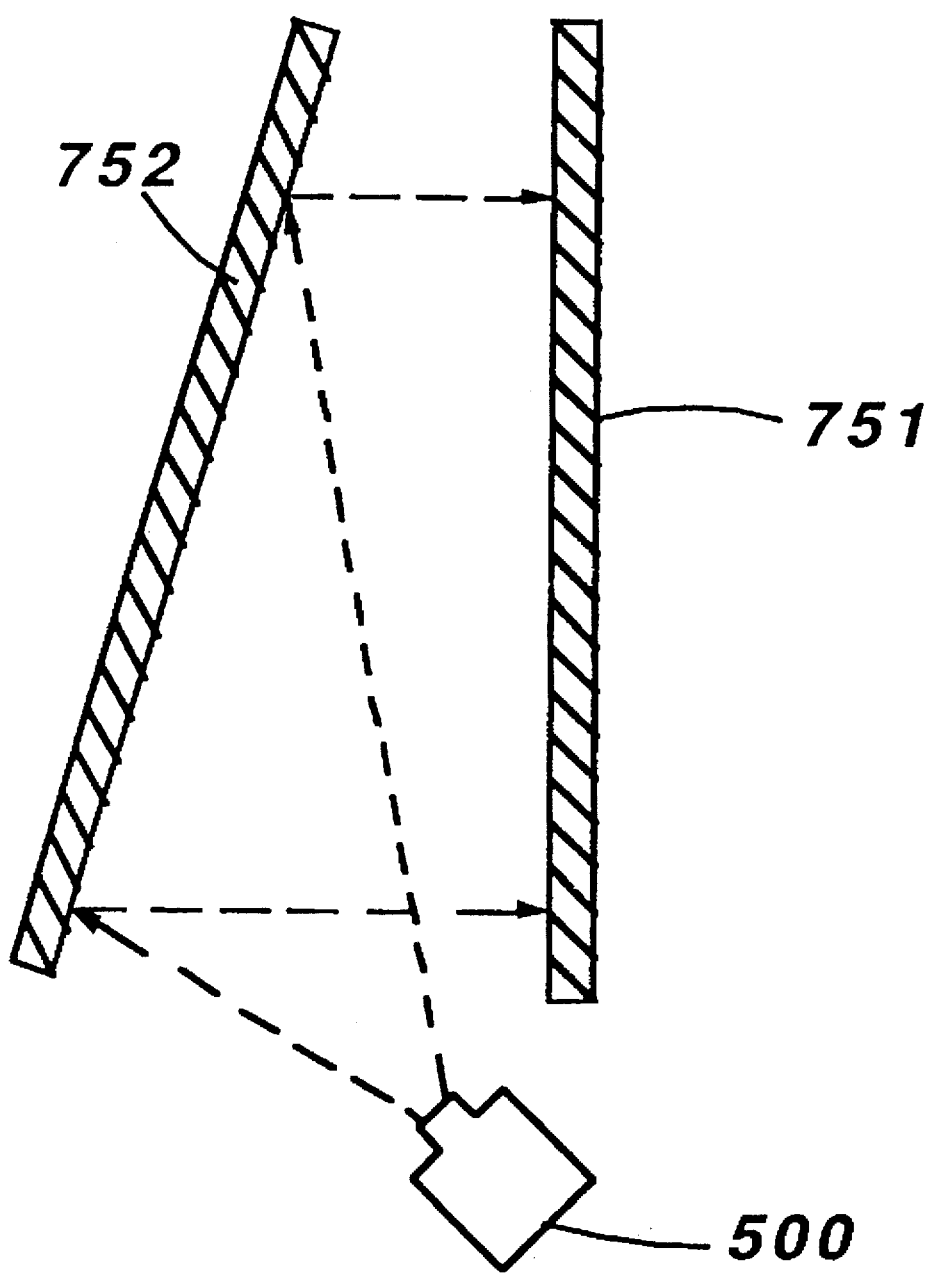

Another embodiment of the present invention is a projection monitor 700 is shown in FIG. 25. The projection monitor 700 produces multi-color images impinging on an enlarged surface 704 which may be a projection screen, a mirror, or lens. The image output from the projection monitor 700 is passed through an optical arrangement before being projected onto the surface 704.

Within the projector, light from a halogen lamp 705 is directed by a reflector 706 to a crossed pair of dichroic mirrors 708. White light from the lamp 705 is incident on the crossed dichroic mirrors 708 which separate the light into red, green and blue primary color portions. The separated colors of light are directed by adjacent mirrors 709 to illuminate the back side of each of three liquid crystal light valve matrices 710 each of which are fabricated according to the invention. Each light valve matrix 710 comprises an array of transistors, an array of electrodes, polarizers, cover glass, and drivers formed in a thin film of crystalline silicon and an adjacent liquid crystal material through which light is selectively transmitted to the surface 704.

Each light valve matrix 710 is controlled by a driver circuit to modulate the transmission of individual light valves so that illuminating light may be selectively guided or blocked through the liquid crystal material to form an image in the respective primary color at the front side of the matrix 710. The three primary color images are optically combined by a dichroic prism 712 into a single multi-color light beam. The light beam is projected by a lens 714 to the surface 704.

The projection system 700 may also employ a single light valve matrix modulated to produce a monochrome light beam which is projected onto the enlarged surface. In another embodiment, each light valve matrix employs a ferroelectric material through which light is selectively transmitted to a viewing surface for display.

Referring to FIG. 25, a projection monitor 500 includes an optical arrangement for directing the light beam to a screen 751. The projection monitor projects a monochrome or multi-color light beam to a mirror 752. The mirror 752 is positioned at an angle relative to the projection monitor such that light reflecting off the minor is collimated. The collimated light is directed to the back side of the large viewing screen 751. Images may be viewed at the front side of the screen 751.

Figure 27A:
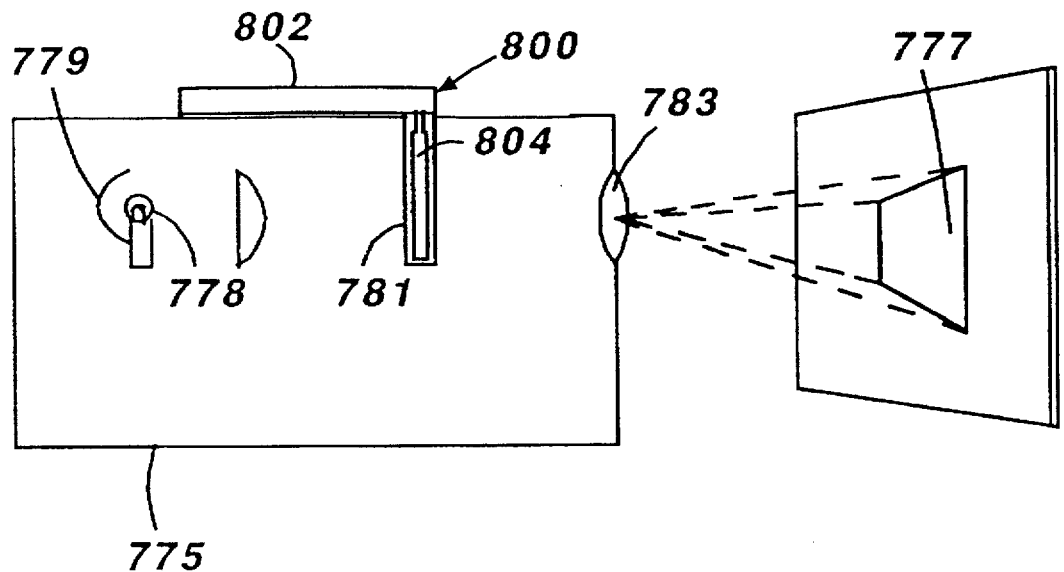

Other embodiments of the present invention are active matrix (AM) slide assemblies adapted for use in a conventional 35 mm slide projector to provide monochrome or multi-color images. A conventional slide projector 775 is illustrated in FIG. 27A. The projector 775 produces monochrome or multi-color images 777 from slide transparencies that are projected to an enlarged surface which may be a projection screen or any relatively flat surface.

Within the slide projector 775, light from a halogen lamp 778 is directed by a reflector 779 to a slide chamber 781. The white light from the lamp 778 is directed to a slide transparency (not shown) positioned in the slide chamber 781. The image is projected by the optical system 783 to the enlarged surface. In accordance with the present invention, the active matrix slide 804 is adapted to be securely positioned in the slide chamber for selectively transmitting light from the lamp to provide monochrome or multi-color images to the optical system for projection onto a viewing surface.

Figure 27B:
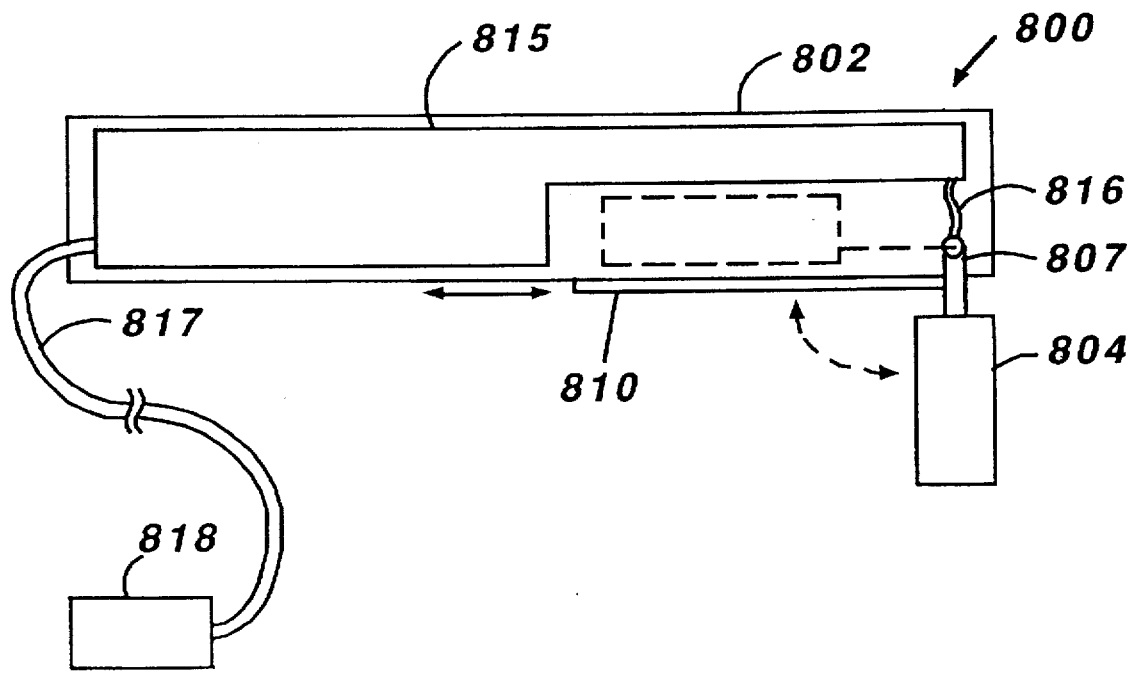

A preferred slide projector embodiment using an active matrix slide assembly 800 is illustrated in FIG. 27B. The slide assembly 800 includes a housing 802 and an active matrix slide 804. The slide 804 is rotatably mounted to the housing 802 by an arm 807. As such, the slide 804 has a storage position shown in dashed lines, and an operating position. When the slide 804 is rotated into the operating position, a sliding shielded cover 810 is moved into a closed position (as shown) for sealing the housing 802.

The housing 802 preferably contains a shielded electronics assembly 815 which is electrically connected to the slide 804 by a cable 816. The electronics assembly 815 has an input cable (or connector) 817 for connecting to an image generation device 818 which may be a computer or any video device. Image data provided by the device 818 is processed by the electronics 815 and sent to the drive circuitry of the AMLCD slide 804.

Reflective Displays

Some implementations of displays use metal layers on fabricated silicon wafers as reflective elements. This is common, for example, in polymer dispersed liquid crystal (PDLC) displays. However, due to the temperature cycling these metal layers experience during the fabrication, a fraction of the deposited metal reflectivity, of the order of 10–20%, is lost. Using the process in this invention, the lost reflectivity may be regained by using the surface of the underside of the deposited metal element as the reflecting surface. This underside surface 16A is shown in FIG. 4 between oxide layer 16 and metal layer 29.

Two Dimensional (2D) Applications

Numerous two dimensional applications exist for this invention. In general, any circuits fabricated in bulk crystalline silicon wafers whose subcircuits crosstalk or interfere with each other's operation through the semiconducting bulk are candidates. In particular, silicon microelectronic circuits which combine analog and digital components are difficult to operate due to certain modes of interference and crosstalk which occurs through the medium of the silicon bulk. By transferring these circuits to a suitable support member the crosstalk is eliminated.

Referring to FIG. 3A, region 36 may contain a circuit, subcircuit or device, and there may be multiple regions like 36 containing different portions of the chip which may be isolated according to the method of this invention.

While specific embodiments of the present invention have been illustrated and described, modifications and changes of the apparatus, parameters, materials, methods of manufacture, use and operation will become apparent to those skilled in the art, without departing from the scope of the invention. It is intended that the following claims define the scope of the invention, and that the structures and methods within the scope of these claims and their equivalents be covered thereby.

What is claimed is:

1. An integrated circuit manufacturing process comprising the steps of:
   (a) preparing at least one patterned, lightly doped region of type 1 conductivity in a crystalline silicon substrate of type 2 conductivity, said patterned region of type 1 conductivity having a surface;
   (b) forming at least one layer on said surface of the patterned doped region of type 1 conductivity;
   (c) removing the substrate of type 2 conductivity to form at least one region of type 1 conductivity supported by said layer.

2. The manufacturing process according to claim 1, wherein said step of removing includes the step of electrochemically etching said crystalline silicon substrate of type 2 conductivity.

3. The manufacturing process according to claim 1, wherein said step of removing includes the step of plasma etching of said crystalline silicon substrate of type 2 conductivity.

4. The manufacturing process according to claim 1, wherein said step of removing includes the step of radiation enhanced etching of said crystalline silicon substrate of type 2 conductivity.

5. The manufacturing process according to claim 1, wherein said step of removing includes the step of chemical etching of said crystalline silicon substrate of type 2 conductivity.

6. The manufacturing process according to claim 1, wherein said step of removing is carried out at temperatures of less than about 120° C.

7. The manufacturing process according to claim 1, wherein said crystalline silicon substrate of type 2 conductivity includes a frontside and a backside;
   wherein at least one patterned doped region of type 1 conductivity is prepared on said frontside; and
   further including the step of bonding said frontside to a support member.

8. The manufacturing process according to claim 7, wherein said support member is made of a material selected from any one of glass, metal, plastic, ceramic, wood and paper.

9. The manufacturing process according to claim 7, wherein said support member is flexible.

10. The manufacturing process according to claim 7, wherein said support member is made of an adhesive material.

11. The manufacturing process according to claim 7, wherein said support member is an intelligent card.

12. The manufacturing process of claim 7 further comprising fabricating circuits or devices in said at least one patterned region wherein said crystalline substrate leaves said circuits or devices on said support member.

13. The manufacturing process of claim 12 wherein the circuits or devices formed in said at least one patterned region are display circuits.

14. The manufacturing process according to claim 1, wherein said step of preparing includes the steps of:
   (a) growing a first silicon oxide layer on a silicon wafer of conductivity type 2;
   (b) implanting one or more wells of conductivity type 1;
   (c) diffusing said one or more wells of conductivity type 1;
   (d) removing said first oxide layer;
   (e) forming a field oxide layer;

(f) patterning and forming a gate oxide layer over said one or more wells;

(g) forming one or more transistors each of which having a source, gate and drain;

(h) forming one or more contact holes; and (i) depositing and patterning a metal layer on said field and gate oxide layer to provide electrically conductive paths to each source, gate and drain of said one or more transistors.

15. The manufacturing process according to claim 14, wherein said step of preparing further includes the steps of holding said metal layer at a distance from a support member and introducing an adhesive layer between.

16. The manufacturing process according to claim 15, wherein said support member is optically transparent.

17. The manufacturing process according to claim 14, wherein said step of removing said crystalline silicon substrate of type 2 conductivity includes the step of providing electrical contact between said metal layer and silicon regions of type 1 conductivity on said front side of said crystalline silicon substrate of type 2 conductivity.

18. The manufacturing process according to claim 17, wherein said step of removing said crystalline silicon substrate of type 2 conductivity includes the step of forming said silicon regions by electrochemically etching said crystalline silicon substrate of type 2 conductivity, to permit the formation of said silicon regions of type 1 conductivity accompanied by the elimination of surrounding silicon in the same step, whereby the electrical junctions between silicon regions of opposite conductivity types determine the boundaries of said regions.

19. The manufacturing process according to claim 1, wherein forming the one layer on said surface of the patterned doped region of type 1 conductivity is carried out by forming the layer from a conductive material.

20. The manufacturing process according to claim 1, wherein removing the substrate is carried out by thinning the substrate, and then removing the remaining substrate.

21. The manufacturing process according to claim 20, wherein thinning the substrate is carried out by etching selected from the group consisting of chemical etching, radiation enhanced etching, plasma etching, and electrochemical etching.

22. The semiconductor process according to claim 1, wherein said region includes a transistor.

23. The semiconductor process according to claim 1, wherein said region includes a double gate MOSFET.

24. The semiconductor process according to claim 1, wherein said region includes a three-dimensional inverter.

25. The semiconductor process according to claim 1, wherein said region includes a vertical bipolar transistor.

* * * * *